United States Patent
Takeo et al.

(10) Patent No.: US 8,685,491 B2
(45) Date of Patent: Apr. 1, 2014

(54) METHOD OF MANUFACTURING MAGNETORESISTIVE ELEMENT

(75) Inventors: Akihiko Takeo, Kunitachi (JP); Yoshihiko Fuji, Kawasaki (JP); Hiromi Yuasa, Kawasaki (JP); Michiko Hara, Yokohama (JP); Shuichi Murakami, Tokyo (JP); Hideaki Fukuzawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 355 days.

(21) Appl. No.: 13/186,389

(22) Filed: Jul. 19, 2011

(65) Prior Publication Data

US 2012/0050920 A1    Mar. 1, 2012

(30) Foreign Application Priority Data

Sep. 1, 2010    (JP) ................. 2010-196049

(51) Int. Cl.
    *G11B 5/48*    (2006.01)
(52) U.S. Cl.
    USPC .................. 427/128; 360/324; 428/811.3
(58) Field of Classification Search
    USPC ........... 360/324; 427/127, 128, 132; 428/811, 428/811.3
    See application file for complete search history.

(56) References Cited

FOREIGN PATENT DOCUMENTS

| JP | 2002-076473 | 3/2002 |
|---|---|---|
| JP | 2004-006589 | 1/2004 |
| JP | 2004-039672 | * 2/2004 |
| JP | 2004-527099 | 9/2004 |
| JP | 2006-332340 | 12/2006 |
| JP | 2007-214333 | 8/2007 |
| JP | 2009-0182129 | * 8/2009 |
| JP | 2009-283499 | 12/2009 |
| JP | 2010-080790 | 4/2010 |
| WO | WO-03/092083 | 11/2003 |

OTHER PUBLICATIONS

Japanese Office Action dated Nov. 16, 2011, filed in Japanese counterpart Application No. 2010-196049, 7 pages (with English translation).

* cited by examiner

*Primary Examiner* — Michael Cleveland
*Assistant Examiner* — Tabassom Tadayyon Eslami
(74) *Attorney, Agent, or Firm* — Patterson & Sheridan LLP

(57) ABSTRACT

According to one embodiment, a method of manufacturing a magnetoresistive element includes a layered structure and a pair of electrodes, the layered structure including a cap layer, a magnetization pinned layer, a magnetization free layer, a spacer layer and a functional layer provided in the magnetization pinned layer, between the magnetization pinned layer and the spacer layer, between the spacer layer and the magnetization free layer, in the magnetization free layer, or between the magnetization free layer and the cap layer and including an oxide, the method including forming a film including a base material of the functional layer, performing an oxidation treatment on the film using a gas containing oxygen in a form of at least one selected from the group consisting of molecule, ion, plasma and radical, and performing a reduction treatment using a reducing gas on the film after the oxidation treatment.

13 Claims, 11 Drawing Sheets

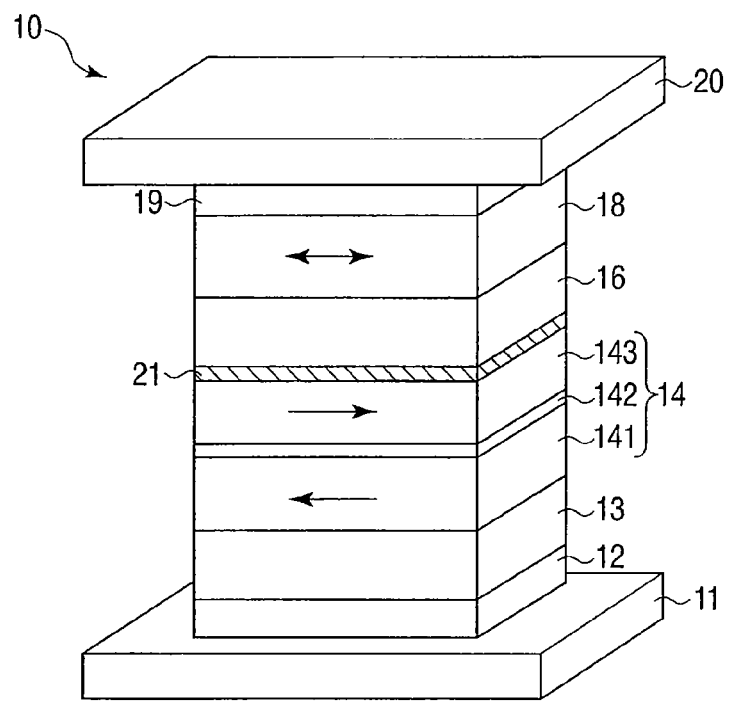
F I G. 6
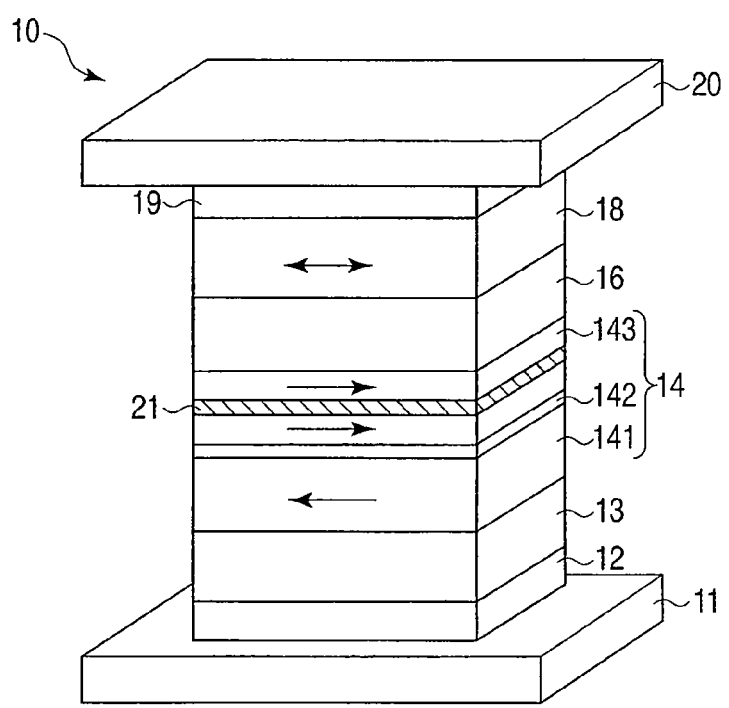
F I G. 7

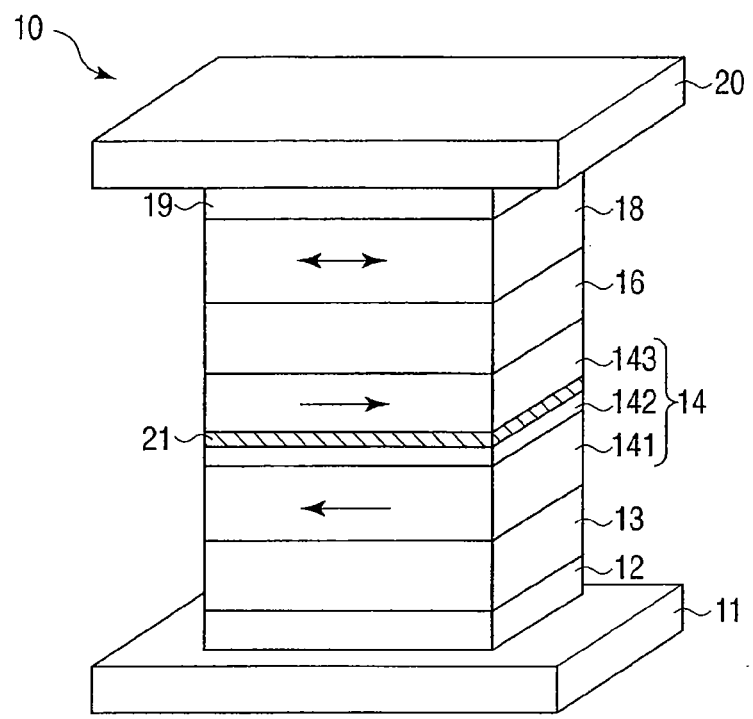
F I G. 8
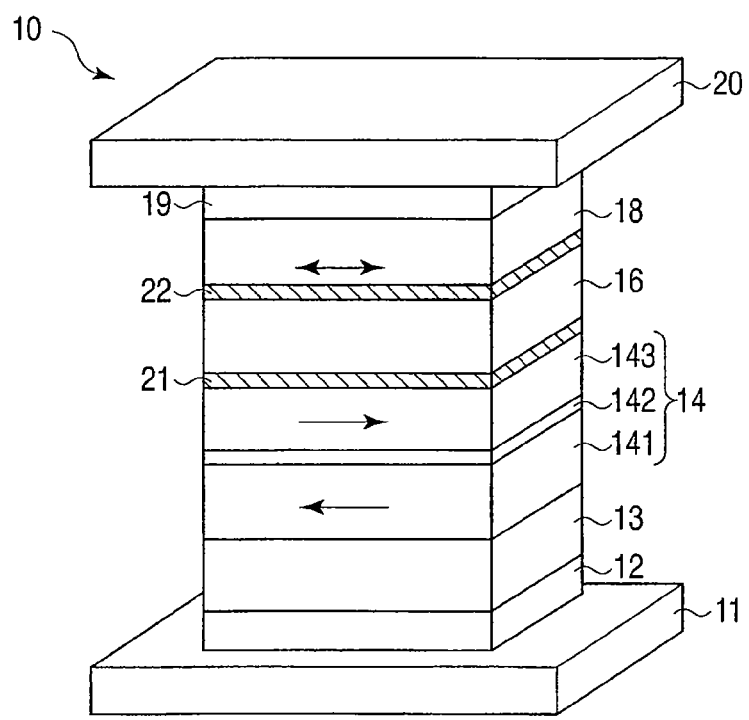
F I G. 9

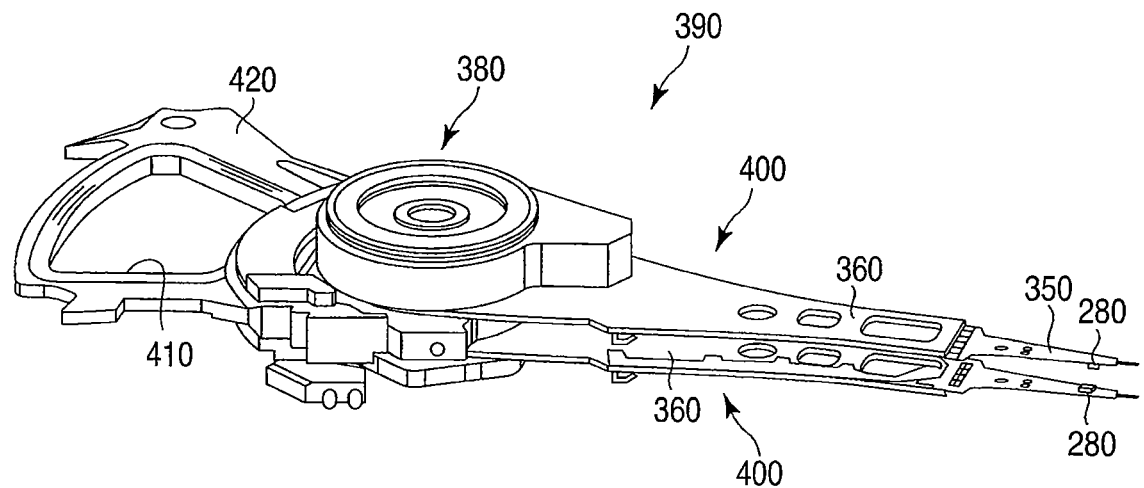
F I G. 14A
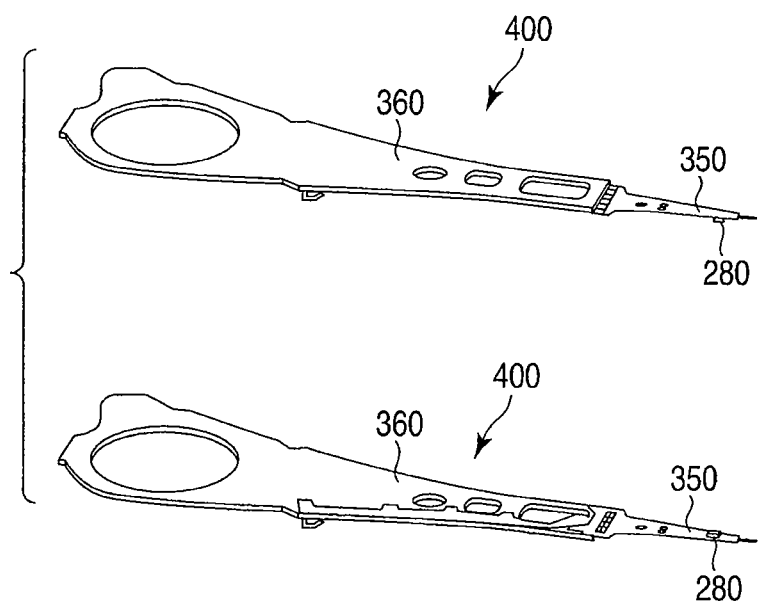
F I G. 14B

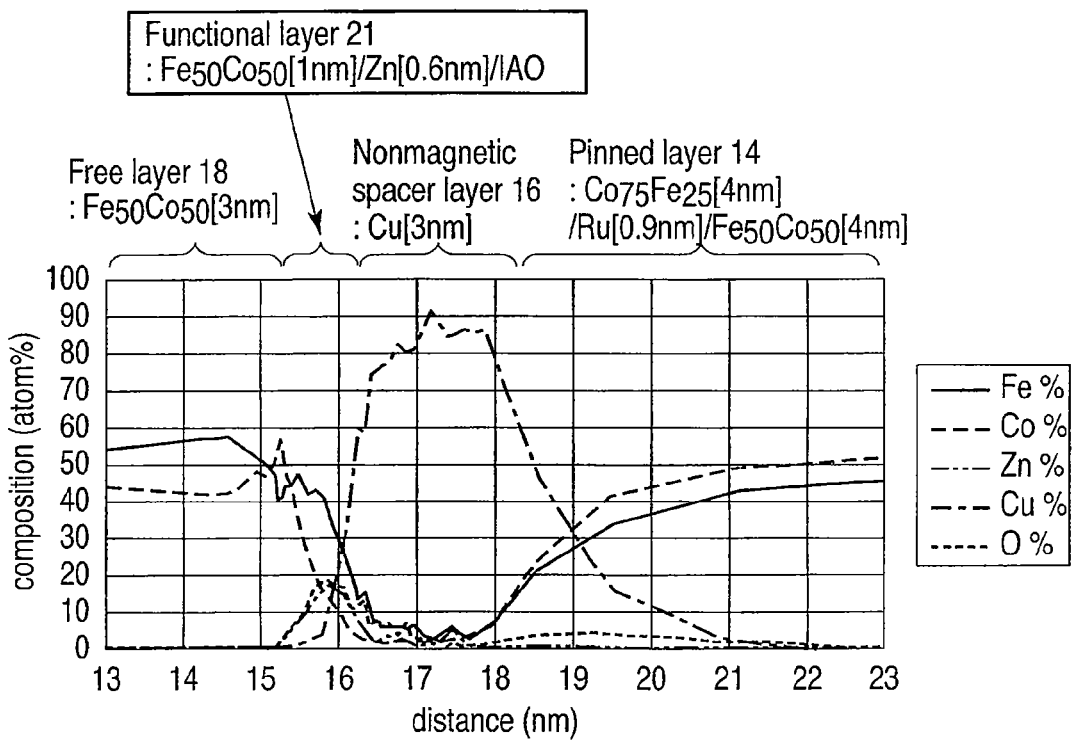
F I G. 16A
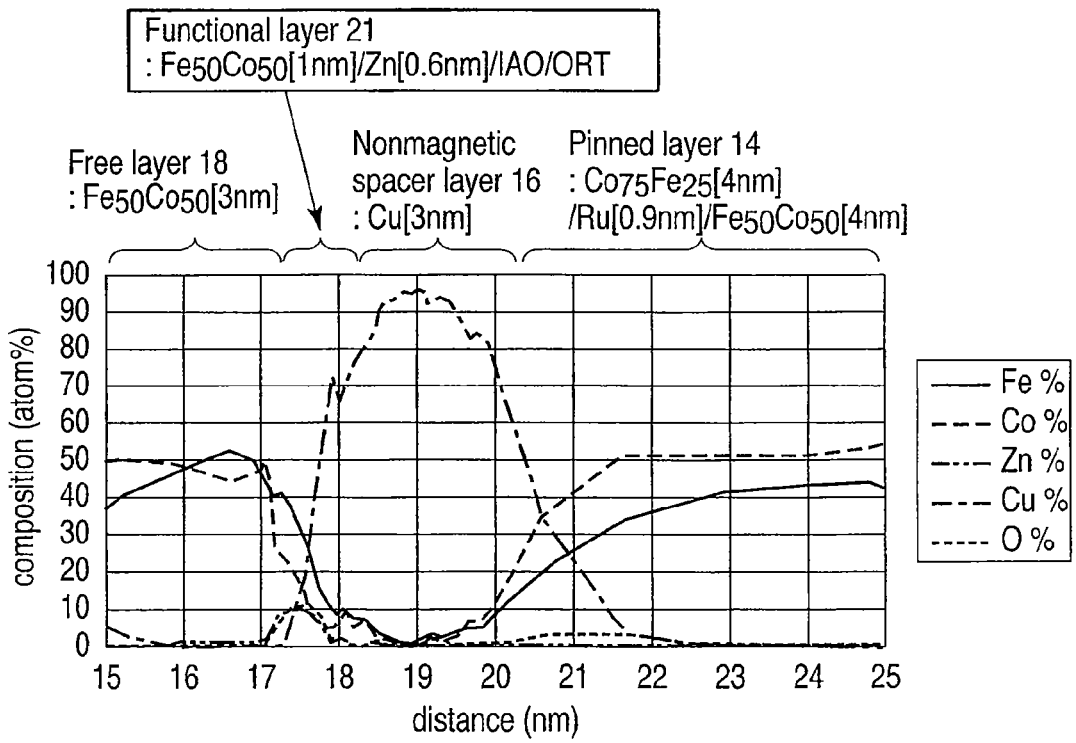
F I G. 16B

METHOD OF MANUFACTURING MAGNETORESISTIVE ELEMENT

CROSS-REFERENCE TO RELATED APPLICATIONS

This application is based upon and claims the benefit of priority from Japanese Patent Application No. 2010-196049, filed Sep. 1, 2010; the entire contents of which are incorporated herein by reference.

FIELD

Embodiments described herein relate generally to a method of manufacturing a magnetoresistive element, a magnetoresistive element, a magnetic head assembly and a magnetic recording apparatus.

BACKGROUND

Improvement of the quality of a magnetoresistive (MR) element requires the increase of the MR ratio. For the purpose of increasing the MR ratio, modification of the structure of magnetoresistive elements and selection of the spacer layer materials have been carried out. For example, a magnetoresistive element including a thin spin-filter (SF) layer made of an oxide or nitride within each ferromagnetic layer or between the ferromagnetic layer and a non-magnetic spacer layer is proposed. The SF layer has a spin-filter effect of inhibiting the passage of upspin or downspin electrons, and thus increases the MR ratio. Thus, magnetoresistive elements have undergone many improvements, but are required to achieve further increase of the MR ratio.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 6 is a view showing a magnetoresistive element according to a third modification example;

FIG. 7 is a view showing a magnetoresistive element according to a forth modification example;

FIG. 8 is a view showing a magnetoresistive element according to a fifth modification example;

FIG. 9 is a view showing a magnetoresistive element according to a sixth modification example;

FIGS. 14A and 14B are views showing a head stack assembly according to the embodiment;

FIGS. 16A and 16B are views showing elements contained in layers of the magnetoresistive elements.

DETAILED DESCRIPTION

Figure 1:
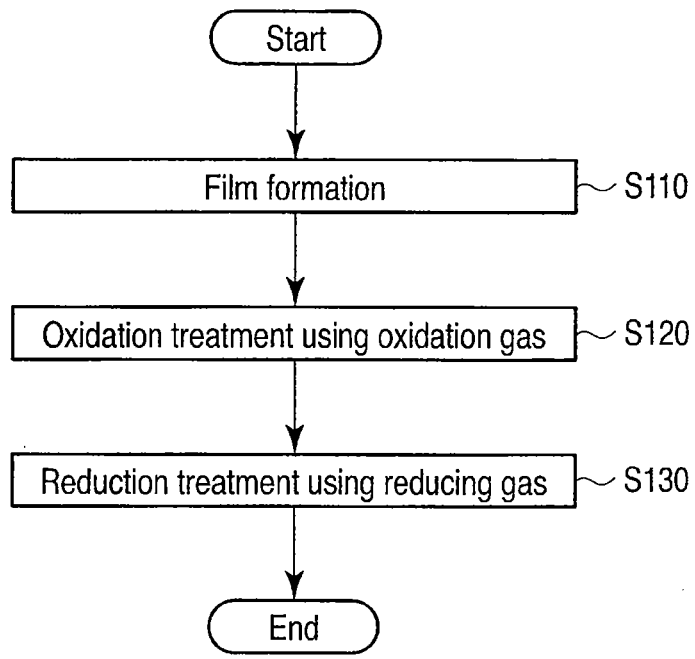
FIG. 1 is a flowchart showing a part of method of manufacturing a magnetoresistive element according to one embodiment.

Various embodiments will be described hereinafter with reference to the accompanying drawings. In the drawings in the following description, components having an identical reference number are identical to each other, and overlapping description is not repeated.

In general, according to one embodiment, a method of manufacturing a magnetoresistive element comprises a layered structure and a pair of electrodes allowing an electric current to flow through the layered structure in a thickness direction, the layered structure comprising a cap layer, a magnetization pinned layer, a magnetization free layer provided between the cap layer and the magnetization pinned layer, a spacer layer provided between the magnetization pinned layer and the magnetization free layer and a functional layer provided in the magnetization pinned layer, between the magnetization pinned layer and the spacer layer, between the spacer layer and the magnetization free layer, in the magnetization free layer, or between the magnetization free layer and the cap layer and comprising an oxide containing at least one element selected from the group consisting of Zn, In, Sn, and Cd and at least one element selected from the group consisting of Fe, Co, and Ni, the method comprising forming a film comprising a base material of the functional layer, performing an oxidation treatment on the film using a gas containing oxygen in a form of at least one selected from the group consisting of molecule, ion, plasma and radical and performing a reduction treatment using a reducing gas on the film after the oxidation treatment.

As a magnetoresistive element according to the embodiment, a CPP-GMR (current-perpendicular-to-plane giant magnetoresistive) element or a TMR (tunneling magnetoresistive) element including a spin-valve film is conceived. A spin-valve film is a layered film having a sandwich structure in which a nonmagnetic spacer layer is sandwiched between two ferromagnetic layers, and a layered film structure portion which causes a resistance change is also called a spin-dependent scattering unit. A magnetization direction of one of the two ferromagnetic layers (referred to as a "pinned layer" or "magnetization pinned layer") is pinned by an antiferromagnetic layer or the like. A magnetization direction of the other ferromagnetic layer (referred to as a "free layer" or "magnetization free layer") is changeable by an external magnetic field. In the spin-valve film, a large magnetoresistive effect is attained by a change in relative angle of the magnetization directions of the two ferromagnetic layers. In the CPP-GMR element and the TMR element, a current is caused to flow through the spin-valve film in a thickness direction.

[Manufacturing Method]

A method of manufacturing a magnetoresistive element 10 according to the embodiment will be described.

FIG. 1 is a flowchart showing a part of the method of manufacturing a magnetoresistive element according to the embodiment. In the flowchart of FIG. 1, details of a process of forming a functional layer 21 are particularly shown. It is possible to manufacture the magnetoresistive element according to the embodiment by sequentially forming layers. Particularly, the formation of the functional layer 21 includes a first step S110, a second step S120, and a third step S130. A film made from a base material of the functional layer is formed in the first step S110; an oxidation treatment using a gas containing oxygen in a form of at least one selected from the group consisting of molecule, ion, plasma and radical is performed on the film in the second step S120; and a reduction treatment using a reducing gas is performed on the film after the oxidation treatment in the third step S130. In contrast, in conventional manufacturing methods, only the film formation and the oxidation treatment are performed, and the reduction treatment is not performed.

In the present embodiment, the film formation method used in manufacture of the element may be, for example, a sputtering method such as DC magnetron sputtering or RF magnetron sputtering, ion beam sputtering, vapor deposition, chemical vapor deposition (CVD), or molecular beam epitaxy (MBE).

Hereinafter, details of the entire manufacturing method will be described. As one example, a method of manufacturing a magnetoresistive element shown in FIG. 2 according to the embodiment will be described.

Firstly, the lower electrode 11 is formed on a substrate by micromachining process. Subsequently, for example, Ta [1 nm]/Ru [2 nm] is formed as the underlayer 12 on the lower electrode 11. The Ta corresponds to a buffer layer which reduces the roughness of the lower electrode 11. The Ru layer corresponds to a seed layer which controls the crystalline orientation and crystal grain size in the spin valve film formed thereon.

Then, the pinning layer 13 is formed on the underlayer 12. The material of the pinning layer 13 may be an antiferromagnetic material such as PtMn, PdPtMn, IrMn, or RuRhMn.

The pinned layer 14 is formed on the pinning layer 13. The pinned layer 14 may be, for example, a synthetic pinned layer made of the lower pinned layer 141 ($Co_{75}Fe_{25}$ [3.2 nm]), the magnetic coupling layer 142 (Ru), and the upper pinned layer 143 ($Co_{50}Fe_{50}$ [3 nm]).

Subsequently, a spacer layer 16 is formed on a pinned layer 14. As the spacer layer 16, a nonmagnetic metal layer containing at least one element selected from Cu, Ag, and Au, a CCP spacer layer, or a tunneling insulator is formed.

Subsequently, the functional layer 21 is formed on the spacer layer 16.

More specifically, a metal layer of $Fe_{50}Co_{50}$ and Zn is formed on an upper pinned layer 143 as the first step S110. The metal layer made of $Fe_{50}Co_{50}$ and Zn may be a stack of $Fe_{50}Co_{50}$ and Zn layers such as $Fe_{50}Co_{50}/Zn$, $Zn/Fe_{50}Co_{50}$, or $(Fe_{50}Co_{50}/Zn) \times 2$, or a single layer of an alloy such as $Zn_{50}(Fe_{50}Co_{50})_{50}$. As the first step S110, a metal layer containing at least one element selected from the group consisting of Zn, In, Sn, and Cd and at least one element selected from the group consisting of Fe, Co, and Ni may be formed.

Next, as the second step S120, the oxidation treatment is performed on the metal material containing Zn and $Fe_{50}Co_{50}$. The oxidation treatment may use ion-assisted oxidation (IAO), which is carried out by feeding oxygen to the metal material layer under irradiation with rare gas ion beams or plasma. In the ion-assisted oxidation treatment, oxygen gas ion beams or plasma may be used. The energy assistance using ion beam irradiation in the treatment of the metal material layer allows the formation of a stable and uniform oxide layer as the functional layer 21. In order to form the functional layer 21 having a single layer structure, the formation and oxidation treatment of the above-described metal material layer may be repeated several times. In this case, instead of performing the film formation and oxidation each only one-time in order to form the functional layer 21 having a predetermined thickness, it is more preferred that formation of a thinner metal material layer and the oxidation treatment thereof are repeated alternately. Alternatively, the metal material layer containing Zn and $Fe_{50}Co_{50}$ may be exposed to an oxygen atmosphere for natural oxidation. In order to form a stable oxide, energy-assisted oxidation is preferred. Alternatively, a stack of Zn and $Fe_{50}Co_{50}$ metal materials is preferably oxidized under irradiation with an ion beam, thereby forming the functional layer 21 made of uniformly mixed Zn with $Fe_{50}Co_{50}$.

In the case of using an ion beam or plasma of a rare gas or the like, a gas containing at least one selected from the group consisting of argon, xenon, helium, neon, and krypton may be used as the rare gas.

The energy assistance may use heat treatment in place of the irradiation with an ion beam. In this case, for example, oxygen may be fed to the formed metal material layer under heating at 100 to 300° C.

The beam conditions for ion beam-assisted conversion treatment for forming the functional layer 21 are described below. When the formation of the functional layer 21 by conversion treatment uses the above-described irradiation with rare gas ions or plasma, the accelerating voltage V is preferably from 30 to 130 V, and the beam electric current Ib is preferably from 20 to 200 mA. These conditions are markedly milder in comparison with the conditions for ion beam etching. The functional layer 21 may be formed in the same manner using plasma such as RF plasma in place of ion beams. The angle of incidence of the ion beam is changed as appropriate from 0 to 80°, based on the definition that the angle of the beam perpendicular to the layer surface is 0°, and that parallel to the layer surface is 90°. The treatment time of the process is preferably from 15 seconds to 1200 seconds, and more preferably 30 seconds or more, from the viewpoint of controllability. If the treatment time is too long, the productivity of the magnetoresistive element deteriorates. From these viewpoints, the treatment time is preferably from 30 seconds to 600 seconds.

In the oxidation treatment using ions or plasma, the oxygen exposure dose is preferably from $1 \times 10^3$ to $1 \times 10^4$ L [Langmiur, 1 L=$1 \times 10^{-6}$ Torr×sec] for IAO, or from $3 \times 10^3$ to $3 \times 10^4$ L for natural oxidation.

Next, as the third step, the reduction treatment using the reducing gas is performed. As the reducing gas, a gas containing at least one selected from the group consisting of argon, helium, neon, krypton and xenon in a form of ion, plasma or radical and/or at least one selected from the group consisting of hydrogen and nitrogen in a form of molecule, ion, plasma or radical may be used. Particularly, it is preferable to use the gas containing at least one selected from the group consisting of argon, helium, neon, krypton, xenon, hydrogen and nitrogen in a form of ion or plasma as the reducing gas. It is further preferable to use the gas containing argon in a form of ion or plasma as the reducing gas.

By the reduction treatment, it is possible to adjust an oxidation number of the film made from the base material after the oxidation treatment. For example, in the case of using the oxide containing Zn and $Fe_{50}Co_{50}$ as a functional layer, the Zn—Fe oxide functional layer after the oxidation treatment is a mixed oxide of Zn—Fe oxides having various crystal structures such as (Fe—Co—Zn)$_3$O$_4$, α-(Fe—Co—Zn)$_2$O$_3$, and γ-(Fe—Co—Zn)$_2$O$_3$. Though (Fe—Co—Zn)$_3$O$_4$ is a conductor and desirable oxide from the viewpoint of attaining low resistivity, $\alpha$-(Fe—Co—Zn)$_2$O$_3$ and $\gamma$-(Fe—Co—Zn)$_2$O$_3$ are insulating oxides, and the presence of $\alpha$-(Fe—Co—Zn)$_2$O$_3$ and $\gamma$-(Fe—Co—Zn)$_2$O$_3$ entails an increase in resistivity of the functional layer. In the manufacturing method according to the embodiment, the reduction treatment using the reducing gas is performed on the functional layer as the third step, and oxidation numbers of $\alpha$-(Fe—Co—Zn)$_2$O$_3$, $\gamma$-(Fe—Co—Zn)$_2$O$_3$, and the like are reduced for conversion into (Fe—Co—Zn)$_3$O$_4$, thereby giving a spin filtering layer having low resistivity. Thus, it is possible to realize a high MR change ratio due to a high spin filtering effect attained by the suppression of occurrence of spin-flip.

In the third step, the reduction treatment may be performed while heating the film made from the base material after the oxidation treatment. For example, the reduction treatment may be performed on the base material which is heated to 100° C. to 300° C. It is possible to more efficiently perform the reduction treatment by the heating.

After the third step, at least one moisture elimination treatment selected from the group consisting of irradiation with argon ions, irradiation with argon plasma, and heating may be performed as a fourth step. By means of the treatment, it is possible to eliminate moisture produced during the reduction treatment.

Also, when manufacturing the functional layer 21, the third step and the fourth step may be repeated after finishing the first step to the fourth step. By alternately repeating the elimination of produced moisture and the reduction treatment, it is possible to more efficiently reduce the film.

Further, a specific step may be repeated a plurality of times in the aim of realizing good reduction in the case where sufficient reduction is desired, a film thickness is too great, or the like. For example, the first step, the second step, the third step, and the fourth step may be repeated a plurality of times. In this case, a series of treatments including the film formation, the oxidation treatment, the reduction treatment, and the moisture elimination is repeated a plurality of times. Alternatively, the first step, the second step, and the third step may be repeated a plurality of times. In this case, a series of treatments including the film formation, the oxidation treatment, and the reduction treatment is repeated a plurality of times, and, in the case of performing the fourth step, the moisture elimination step is performed lastly. Alternatively, the first step and the second step may be repeated a plurality of times. In this case, after the film formation and the oxidation treatment are performed alternately, the reduction treatment is performed (and moisture elimination is arbitrarily performed). As described above, it is preferable to perform the film formation and the oxidation treatment repeatedly and thereby form the film gradually rather than to form the whole film at once by performing the film formation and the oxidation treatment at once.

Particularly, beam conditions in the case of performing the Ar ion beam irradiation in the above-described reduction treatment will be described below. In the reduction treatment, when the irradiation of the rare gas in a form of ion or plasma is used, an acceleration voltage V may preferably be set to 30 to 130 V, and a beam current Ib may preferably be set to 20 to 200 mA. These conditions are considerably weak as compared to conditions for performing ion beam etching. It is possible to form the functional layer 21 in the same way by using plasma such as RF plasma in place of the ion beam. An incident angle of the ion beam is appropriately changed within a range of 0° to 80° when the incidence which is vertical to a film surface is defined as 0° and the incidence which is parallel to the film surface is defined as 90°. A treatment time of the step may preferably be 15 to 1200 seconds, more preferably 30 seconds or more from the viewpoints of controllability and the like. When the treatment time is too long, productivity of the magnetoresistive element is unpreferably degraded. The treatment time may preferably be 30 to 600 seconds from these viewpoints.

Then, the free layer 18 is formed on the functional layer 21. The free layer 18 is, for example, Fe$_{50}$Co$_{50}$ [1 nm]/Ni$_{85}$Fe$_{15}$ [3.5 nm].

The cap layer 19 is formed on the free layer 18. The cap layer 19 may be, for example, Cu [1 nm]/Ru [10 nm].

Thereafter, annealing treatment is carried out.

Finally, the upper electrode 20 for allowing electric current to flow through the magnetoresistive element 10 in a direction perpendicular to the magnetoresistive element 10 is formed on the cap layer 19.

[Magnetoresistive Element]
(Embodiment)

Figure 2:
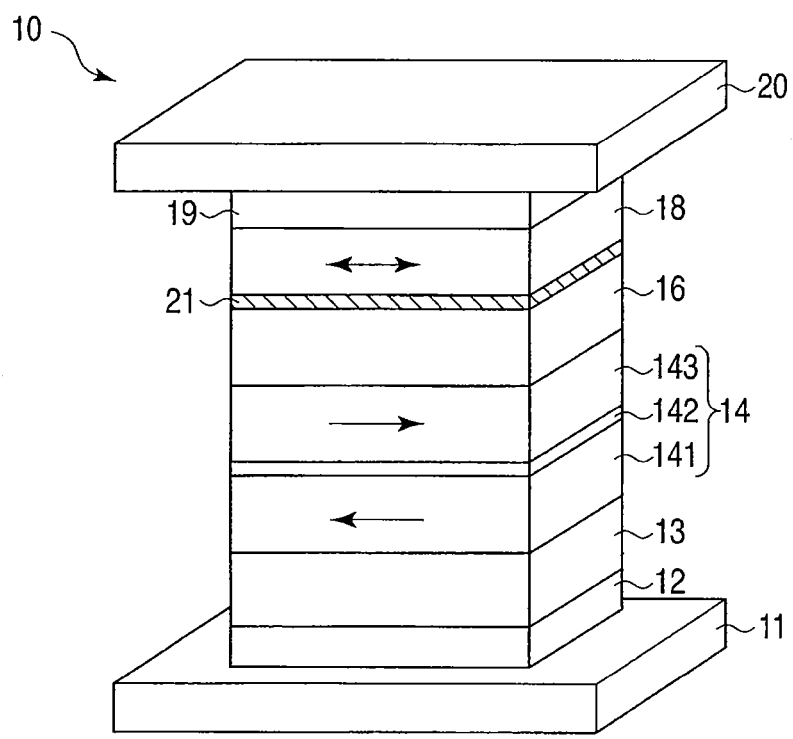
FIG. 2 is a view showing the magnetoresistive element according to the embodiment.

FIG. 2 shows the magnetoresistive element 10 according to the embodiment.

The magnetoresistive element 10 according to the present embodiment includes a cap layer 19 which protects the magnetoresistive element 10 from deterioration such as oxidation, a magnetization pinned layer (hereinafter referred to as a pinned layer) 14 in which magnetization has been fixed, a magnetization free layer (hereinafter referred to as a free layer) 18 which is provided between the cap layer 19 and the pinned layer 14, and in which magnetization freely rotates, a spacer layer 16 provided between the pinned layer 14 and the free layer 18, and a functional layer 21 which is provided between the spacer layer 16 and the free layer 18 and includes an oxide that includes at least one element selected from the group consisting of Zn, In, Sn and Cd and at least one element selected from the group consisting of Fe, Co and Ni. The structure in which the components including the cap layer 19, the free layer 18, the functional layer 21, the spacer layer 16, and the pinned layer 14 are stacked is defined as a stack.

The magnetoresistive element 10 also includes a pair of electrodes (lower electrode 11 and upper electrode 20) which allow electric current to flow through the stack in a direction perpendicular to the surface of the stack. These electrodes are in contact with the outermost layers of the stack, respectively. The electrode on the pinned layer 14 side of the stack is referred to as the lower electrode 11, and the electrode on the free layer 18 side of the stack is referred to as the upper electrode 20. Further, the magnetoresistive element 10 includes a pinning layer 13 which is provided between the lower electrode 11 and the pinned layer 14, and is made of an antiferromagnetic substance for fixing the magnetization direction of the pinned layer 14, and an underlayer 12 provided between the pinning layer 13 and the lower electrode 11.

The lower electrode 11 and the upper electrode 20 allow electric current to flow through the magnetoresistive element 10 in a direction perpendicular to the surface of the magnetoresistive element 10. That is, when voltage is applied between the lower electrode 11 and the upper electrode 20, an electric current flows through the magnetoresistive element 10 perpendicularly to the surface of the magnetoresistive element 10.

The passage of the electric current allows the detection of the resistance change due to magnetoresistance, and thus allows the detection of magnetism. The lower electrode 11 and the upper electrode 20 are made of, for example, Cu, or Au having a relatively small electrical resistance thereby allowing electric current to flow through the magnetoresistive element 10.

The underlayer 12 has, for example, a structure in which a buffer layer and a seed layer are stacked. The buffer layer is positioned on the side of the lower electrode 11, and the seed layer is positioned on the side of the pinning layer 13.

The buffer layer reduces the effect of surface roughness of the lower electrode 11, and improves the crystallinity in the layer stacked on the buffer layer. The buffer layer may be made of, for example, Ta, Ti, V, W, Zr, Hf, Cr, or an alloy thereof. The thickness of the buffer layer is preferably 1 nm or more and 10 nm or less, and more preferably 2 nm or more and 5 nm or less. If the thickness of the buffer layer is too small, the buffer effect is lost. On the other hand, if the thickness of the buffer layer is too large, series resistance, which will not contribute to the MR ratio, will increase. When the seed layer formed on the buffer layer has a buffer effect, the buffer layer may not necessary. As a preferred example, a Ta layer may be formed to have a thickness of 3 nm.

The seed layer controls the crystalline orientation and crystal grain size in the layer stacked on the seed layer. The seed layer is preferably made of a metal having a face-centered cubic (fcc) structure, a hexagonal close-packed (hcp) structure, or a body-centered cubic (bcc) structure.

For example, the seed layer may be made of Ru having a hcp structure or NiFe having an fcc structure, such that the crystalline orientation of the overlying spin-valve film has an fcc (111) orientation. When the pinning layer 13 is made of IrMn, a good fcc (111) orientation is achieved. When the pinning layer 13 is made of PtMn, a regulated face-centered tetragonal (fct) (111) structure is obtained. When the free layer 18 and the pinned layer 14 are made of an fcc metal, a good fcc (111) orientation is achieved. When the free layer 18 and the pinned layer 14 are made of a bcc metal, a good bcc (110) orientation is achieved. The thickness of the seed layer is preferably 1 nm or more and 5 nm or less, and more preferably 1.5 nm or more and 3 nm or less, such that the seed layer sufficiently improves the crystalline orientation. As a preferred example, an Ru layer may be formed to have a thickness of 2 nm.

Alternatively, the seed layer may be made of, in place of Ru, a NiFe-based alloy (for example, $Ni_xFe_{100-x}$, (x=90 to 50%, preferably 75 to 85%), or $(Ni_xFe_{100-x})_{100-y}X_y$ [X=Cr, V, Nb, Hf, Zr, Mo]), which has been prepared by adding a third element X to NiFe thereby nonmagnetizing it, may be used. When an NiFe-based seed layer is used, a good crystalline orientation is relatively easily obtained, and a half width of the rocking curve within a range of 3 to 5° can be achieved.

The seed layer improves the crystalline orientation, and controls the crystal grain size in the spin-valve film. More specifically, the seed layer adjusts the crystal grain size in the spin-valve film from 5 nm or more and 20 nm or less, thereby achieving a high MR ratio in spite of the decrease in the size of the magnetoresistive element, without variation in the properties.

When the crystal grain size in the seed layer is 5 nm or more and 20 nm or less, diffused reflection of electrons and inelastic scattering sites caused by crystal grain boundaries are decreased. In order to achieve the crystal grain size, for example, an Ru layer is formed to have a thickness of 2 nm. When the seed layer is made of $(Ni_xFe_{100-x})_{100-y}Z_y$ (Z=Cr, V, Nb, Hf, Zr, Mo), its thickness is preferably 2 nm, wherein the ratio y of a third element X is from about 0 to 30% (including y=0).

The crystal grain size in the spin-valve film may be determined on the basis of the size of the crystal grains in the layer interposed between the seed layer and the spacer layer 16 (for example, by cross-sectional TEM). For example, when the pinned layer 14 is a bottom type spin-valve film underlying the spacer layer 16, the crystal grain size in the spin-valve film may be determined based on the crystal grain sizes in the pinning layer 13 (antiferromagnetic layer) or the pinned layer 14 (magnetization pinned layer) formed on the seed layer.

The pinning layer 13 has a function of imparting unidirectional anisotropy to a ferromagnetic layer serving as a pinned layer 14 to be deposited thereon, thereby pinning magnetization of the ferromagnetic layer. As the material of the pinning layer 13, antiferromagnetic materials such as PtMn, PdPtMn, IrMn and RuRhMn can be used. Among them, IrMn is advantageous for application to heads adapted to high recording density. IrMn can impart unidirectional anisotropy at a smaller thickness than PtMn and is suitable for reducing a gap necessary for high density recording.

In order to impart sufficiently intense unidirectional anisotropy, the thickness of the pinning layer 13 is set appropriately. When the material of the pinning layer 13 is PtMn or PdPtMn, the thickness thereof is preferably approximately 8 to 20 nm, more preferably 10 to 15 nm. When the material of the pinning layer 13 is IrMn, it is possible to impart unidirectional anisotropy even with a thinner film than PtMn or the like, and the thickness thereof is preferably 4 to 18 nm, more preferably 5 to 15 nm. A preferable example includes $Ir_{22}Mn_{78}$ of about 7 nm in thickness.

As the pinning layer 13, a hard magnetic layer may be used instead of the antiferromagnetic layer. As the hard magnetic layer, for example, CoPt (Co=50 to 85%), $(Co_xPt_{100-x})_{100-y}Cr_y$ (x=50 to 85%, y=0 to 40%), FePt (Pt=40 to 60%) can be used. The hard magnetic layer, particular CoPt, has relatively smaller specific resistance and is thus capable of suppressing increase in series resistance and resistance-area product (RA).

The term "resistance-area product" refers to the product obtained by multiplying the sectional area of the magnetoresistive element 10 perpendicular to the stacking direction of the stacked film by the resistance obtained between the pair of electrodes when electric current is allowed to flow perpendicularly to the surface of the stacked film of the magnetoresistive element 10.

The degree of crystalline orientation of the spin-valve film and the pinning layer 13 may be determined by X-ray diffractometry. When the half width of the rocking curve at the fcc (111) peak of the spin-valve film, fct (111) peak or bcc (110) peak of the pinning layer 13 (PtMn) is, for example, 3.5 to 6°, the degree of crystalline orientation is considered to be sufficient. This can also be assessed using the dispersion angle of the diffraction spots obtained using cross-sectional TEM.

The pinned layer 14 has a structure in which a lower pinned layer 141, a magnetic coupling layer 142, and an upper pinned layer 143 are stacked in this order on the pinning layer 13.

The pinning layer 13 and the lower pinned layer 141 are bonded together by magnetic exchange coupling so as to exhibit a unidirectional anisotropy. The lower pinned layer 141 and the upper pinned layer 143 sandwiching the magnetic coupling layer 142 are strongly coupled such that the direction of magnetization are anti-parallel to each other.

The lower pinned layer 141 may be made of, for example, a $Co_xFe_{100-x}$ alloy (x=0 to 100%), a $Ni_xFe_{100-x}$ alloy (x=0 to 100%), or any of these alloy further containing a non-magnetic element. The lower pinned layer 141 may be made of a single element such as Co, Fe or Ni, or an alloy of these elements. Alternatively, a $(Co_xFe_{100-x})_{100-y}B_X$ alloy (x=0 to 100%, x=0 to 30%) may be used. From the viewpoint of reducing the variation in performance among elements each having the magnetoresistive element of a small size, the use of an amorphous alloy such as $(Co_xFe_{100-x})_{100-y}B_X$ is preferred.

The thickness of the lower pinned layer 141 is preferably 1.5 nm or more and 5 nm or less, thereby maintaining a high magnetic field intensity of the unidirectional anisotropy exhibited by the pinning layer 13 and a high magnetic field intensity for the antiferromagnetic coupling between the lower pinned layer 141 and the upper pinned layer 143 via the magnetic coupling layer 142.

If the thickness of the lower pinned layer 141 is too small, the thickness of the upper pinned layer 143 which influences the MR ratio must be decreased, which results in the decrease in the MR ratio. On the other hand, if the thickness of the lower pinned layer 141 is too large, sufficient unidirectional anisotropic magnetic field enough for device operation is hard to obtain.

It is preferable that the magnetic thickness, i.e., (saturation magnetization Bs)×(thickness t) or a product of Bs with t of the lower pinned layer 141 is substantially equal to the magnetic thickness of the upper pinned layer 143. Specifically, it is preferable that the magnetic thickness of the upper pinned layer 143 and the magnetic thickness of the lower pinned layer 141 correspond with each other.

As an example, when the upper pinned layer 143 is ($Fe_{40}Co_{40}B_{20}$ [3 nm], the saturation magnetization of the $Fe_{50}Co_{50}$ in a thin film is approximately 2.2 T, so that the magnetic thickness is 2.2 T×3 nm=6.6 T nm. Since the saturation magnetization of $Co_{75}Fe_{25}$ is approximately 2.1 T, the thickness t of the lower pinned layer 141 which provides the magnetic thickness equal to the above value is 6.6 T nm/2.1 T=3.15 nm. Therefore, it is desirable to use $Co_{75}Fe_{25}$ with a thickness of approximately 3.2 nm.

The symbol '/' used later represents that the elements are stacked in the order from the left of '/' to the right of '/', so that Au/Cu/Ru represents that a Cu layer is stacked on an Au layer, and an Ru layer is stacked on the Cu layer. The symbol '×2' represents two layers, so that (Au/Cu)×2 represents that a Cu layer is stacked on an Au layer, and another Au layer and another Cu layer are stacked in this order on the Cu layer. The symbol '[ ]' represents the thickness of the layer.

The magnetic coupling layer 142 allows an antiferromagnetic coupling between the lower pinned layer 141 and the upper pinned layer 143 sandwiching the magnetic coupling layer 142, thereby forming a synthetic pinned structure. The magnetic coupling layer 142 may be made of Ru, and the thickness of the magnetic coupling layer 142 is preferably 0.8 nm or more and 1 nm or less. The material of the magnetic coupling layer 142 may be other than Ru, as long as the material causes the antiferromagnetic coupling at a sufficiently high intensity between the lower pinned layer 141 and the upper pinned layer 143 sandwiching the magnetic coupling layer 142. The thickness of the magnetic coupling layer 142 may fall within a range of 0.3 to 0.6 nm which corresponds to the first peak of the Ruderman-Kittel-Kasuya-Yoshida (RKKY) coupling, instead of a range of 0.8 nm to 1 nm which corresponds to the second peak of the RKKY coupling. For example, Ru having a thickness of 0.9 nm may be used, thereby stably forming a more reliable coupling and achieving the function of the layer.

The upper pinned layer 143 is a magnetic layer contributing directly to the MR effect, and its constituent material and thickness are both important for obtaining a high MR ratio.

The upper pinned layer 143 may be made of $Fe_{50}Co_{50}$. $Fe_{50}Co_{50}$ is a magnetic material having a bcc structure. Since the material has a high spin-dependent interface scattering effect, it achieves a high MR ratio. Examples of FeCo alloys having a bcc structure include $Fe_xCo_{100-x}$ (x=30 to 100%), and $Fe_xCo_{100-x}$ containing an additional element. Among the materials, $Fe_{40}Co_{60}$ to $Fe_{80}Co_{20}$ which offer sufficient properties in all respects are examples to be readily used.

When the upper pinned layer 143 is made of a magnetic layer having a bcc structure which readily achieves a high MR ratio, the total thickness of the magnetic layer is preferably 1.5 nm or more, thereby maintaining a stable bcc structure. The metal material used to make a spin-valve film often has an fcc or fct structure, so that only the upper pinned layer 143 may have a bcc structure. Therefore, if the thickness of the upper pinned layer 143 is too small, a stable bcc structure may be hard to maintain, which results in a failure to achieve a high MR ratio.

Alternatively, the upper pinned layer 143 may be made of a $(Co_xFe_{100-x})_{100-y}B_x$ alloy (x=0 to 100%, x=0 to 30%). The amorphous alloy such as $(Co_xFe_{100-x})_{100-y}B_X$ is preferred from the viewpoint of reducing the variation in performance among elements due to the effects of crystal grains which cannot be ignored in small magnetoresistive elements. In addition, the upper pinned layer 143 made of the amorphous alloy is so flat that the tunnel insulator formed on the upper pinned layer 143 is also flattened. Flattening of the tunnel insulator reduces the frequency of defects in the tunnel insulator, and thus is important for achieving a high MR ratio with a low RA. In particular, when MgO is used as the material of the tunnel insulator, the use of an amorphous alloy such as $(Co_xFe_{100-x})_{100-y}B_x$ increases the (100) orientation of the MgO layer formed on the tunnel insulator. The (100) orientation of the MgO layer is important for achieving a high MR ratio. In addition, the $(Co_xFe_{100-x})_{100-y}B_x$ alloy is crystallized upon annealing with the (100) plane of MgO as the template, and thus achieves a good crystal lattice match between the MgO and $(Co_xFe_{100-x})_{100-y}B_x$ alloy. The good crystal lattice match is important for achieving a high MR ratio.

In order to achieve a high MR ratio, the upper pinned layer 143 preferably has a large thickness. On the other hand, in order to achieve a pinned magnetic field of high intensity, the thickness is preferably small. Therefore, there is a trade-off relationship. For example, when an FeCo alloy layer having a bcc structure is used, a thickness of 1.5 nm or more is preferred, thereby stabilizing the bcc structure. Also when a CoFe alloy layer having an fcc structure is used, a thickness of 1.5 nm or more is preferred, thereby achieving a high MR ratio. On the other hand, in order to achieve a pinned magnetic field of high intensity, the upper pinned layer 143 preferably has a thickness of 5 nm or less, and more preferably 4 nm or less. As described above, the thickness of the upper pinned layer 143 is preferably 1.5 nm or more and 5 nm or less, and more preferably 2.0 nm or more and 4 nm or less.

The upper pinned layer 143 may be made of, in place of a magnetic material having a bcc structure, a $Co_{90}Fe_{10}$ alloy having an fcc structure, or Co or a Co alloy having an hcp structure, which are widely used in conventional magnetoresistive elements. The upper pinned layer 143 may be made of a single metal such as Co, Fe, or Ni, or an alloy material containing any of these elements. As the magnetic material of the upper pinned layer 143, an FeCo alloy material having a bcc structure, a cobalt alloy containing 50% or more cobalt, or an Ni alloy containing 50% or more Ni is advantageous in achieving a high MR ratio.

The upper pinned layer 143 may be a Heusler alloy layer such as $Co_2MnGe$, $Co_2MnSi$, or $Co_2MnAl$.

The spacer layer 16 decouples magnetic coupling between the pinned layer 14 and a free layer 18. As the spacer layer 16, a nonmagnetic metal layer, a CCP (current-confined-to-path) spacer layer, or a tunneling insulator may be used.

In the case of using the nonmagnetic metal layer as the spacer layer 16, any one of elements of Au, Ag, and Cu may be used. A film thickness of the spacer layer 16 may preferably be 0.5 to 5 nm or less.

Figure 3A:
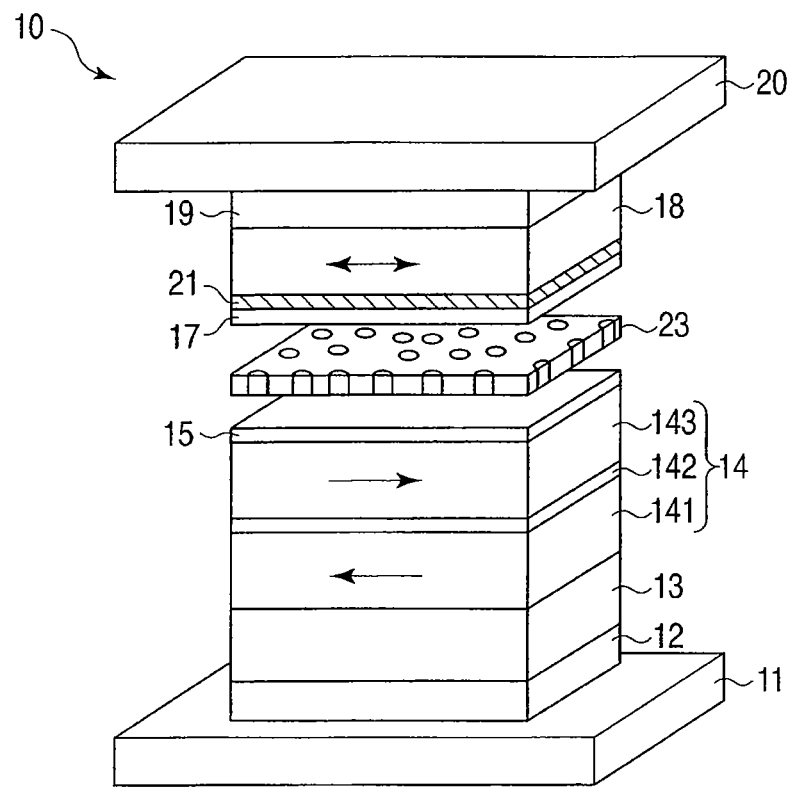
FIGS. 3A and 3B are views showing the magnetoresistive element according to the embodiment.
Figure 3B:
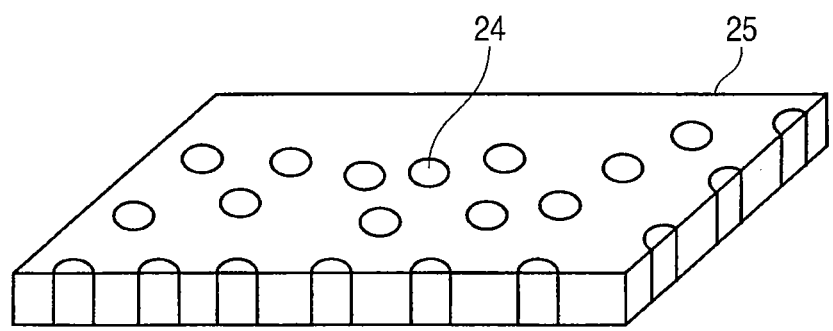

The case of using the CCP spacer layer as the spacer layer 16 will be described by using FIGS. 3A and 3B. As shown in FIG. 3A, the CCP spacer layer is formed of a lower metal layer 15, a current constriction layer 23, and an upper metal layer 17. Further, the current constriction layer 23 comprises an insulating layer 25 and a current path 24. The current path 24 allows a current to pass therethrough.

The lower metal layer 15 is used for forming the current path 24 and is a supply source of the current path 24. Also, when the insulating layer 25 which is above the lower metal layer 15 is formed, the lower metal layer 15 functions as a stopper layer which suppresses oxidation of the upper pinned layer 143 positioned below the lower metal layer 15.

In the case where a constituent material of the current path 24 is Cu, a constituent material of the lower metal layer 15 may preferably be the same (Cu). In the case where the constituent material of the current path 24 is a magnetic material, the magnetic material may be the same as or different from a magnetic material of the pinned layer 14. Au, Ag, or the like may be used as the constituent material of the current path 24 in addition to Cu.

The insulating layer 25 is formed of an oxide, a nitride, an oxynitride, and the like. In order to exhibit the function as the spacer layer, a thickness of the insulating layer 25 may preferably be 1 to 3 nm, more preferably within a range of 1.5 to 2.5 nm.

Typical examples of a material to be used for the insulating layer 25 include $Al_2O_3$ and those obtained by adding an additive element to $Al_2O_3$. For example, $Al_2O_3$ having a film thickness of about 2 nm may be used. Examples of the additive element include Ti, Hf, Mg, Zr, V, Mo, Si, Cr, Nb, Ta, W, B, C, and the like. An amount of the additive element to be added may appropriately be changed within a range of 0% to 50%.

For the insulating layer 25, Mg oxide, Zn oxide, Ti oxide, Hf oxide, Mn oxide, Zr oxide, Cr oxide, Ta oxide, Nb oxide, Mo oxide, Si oxide, V oxide, or the like may be used in place of the Al oxide such as $Al_2O_3$. The above-described additive elements may be used for the oxides, too. An amount of the additive element to be added may appropriately be changed within a range of about 0% to 50%.

For the insulating layer 25, a nitride or an oxynitride based on Al, Si, Hf, Ti, Mg, Zr, V, Mo, Nb, Ta, W, B, or C may be used in place of the oxide.

The current path 24 is the path (route) for allowing a current to flow in a thickness direction of the current constriction layer 23 and constricts the current. The current path 24 functions as a conductor which allows the current to pass in the thickness direction of the insulating layer 25 and is formed of a metal layer of Cu and the like, for example. Namely, the current constriction layer 23 has a current constriction structure (CCP structure), and it is possible to increase the MR change ratio by the current constriction effect. A material to be used for forming the current path 24 (CCP) may be Cu, Au, Ag, Ni, Co, Fe or an alloy layer containing at least one of the elements. For example, the current path 24 may be formed of an alloy layer containing Cu. Also, an alloy layer of CuNi, CuCo, CuFe, or the like may be used. Here, a composition having 50% or more of Cu is preferred for the purposes of attaining the high MR change ratio and downsizing an interlayer coupling field between the pinned layer 14 and the free layer 18.

The current path 24 is a region in which contents of oxygen and nitrogen are considerably lower than those of the insulating layer 25 (content of oxygen or nitrogen in the insulating layer 25 is at least twice that of the current path 24) and is a crystal phase. Since the crystal phase has lower resistance than an amorphous phase, the crystal phase readily functions as the current path 24.

The upper metal layer 17 functions as a barrier layer for suppressing diffusion of oxygen and nitrogen from the current constriction layer 23 into the free layer 18 as well as a seed layer for promoting good crystal growth of the free layer 18. More specifically, the upper metal layer 17 protects the free layer 18 formed thereon so that the free layer 18 is not oxidized or nitrided by contacting the oxide, nitride, and oxynitride of the current construction layer 23. Namely, the upper metal layer 17 restricts a direct contact between the oxygen in the oxide layer of the current path 24 and the free layer 18. Also, the upper metal layer 17 improves crystallinity of the free layer 18. For example, though crystallinity of the metal layer formed on the insulating layer 25 is deteriorated in the case where the material of the insulating layer 25 is amorphous ($Al_2O_3$, for example), it is possible to considerably improve the crystallinity of the free layer 18 by disposing a extremely thin seed layer (Cu layer, for example) which improves the crystallinity.

A material to be used for the upper metal layer 17 may preferably be the same as the material (Cu, for example) of the current path 24 of the current constriction layer 23. An increase in interfacial resistance is caused in the case where the material of the upper metal layer 17 is different from the material of the current path 24, but the increase in interfacial resistance does not occur when the materials are the same. In the case of using a magnetic material for the constituent material of the current path 24, the magnetic material may be the same as or different from the magnetic material of the free layer 18. As the constituent material of the upper metal layer 17, Cu, Au, Ag, or the like may be used.

In the case of using the tunneling insulator as the spacer layer, a nonmagnetic oxide containing at least one element selected the group consisting of Mg, Al, Ti, Zr, Hf, and Zn may be used. Particularly, MgO is preferred from the viewpoints of attaining the high MR change ratio since MgO causes a coherent spin-dependent tunneling phenomenon. Also, a film thickness of the tunneling insulator 16 may preferably be 1 nm or more and 4 nm or less.

The free layer 18 includes a ferromagnetic substance whose magnetization direction is changed by the external magnetic field. For example, the free layer 18 may have a two-layer structure of $Co_{90}Fe_{10}$ [1 nm]/$Ni_{83}Fe_{17}$ [3.5 nm] obtained by forming an NiFe layer and a CoFe layer in this order. When the NiFe layer is not used, a single layer of $Co_{90}Fe_{10}$ [4 nm] may be used. The free layer 18 may have a three-layer structure such as CoFe/NiFe/CoFe.

Among CoFe alloys, $Co_{90}Fe_{10}$ having stable soft magnetic properties is preferred as the material of the free layer 18. When a CoFe alloy having a composition close to that of the $Co_{90}Fe_{10}$ is used, the thickness is preferably 0.5 nm or more and 4 nm or less. A $Co_xFe_{100-x}$ (x=70 to 90%) may be used instead.

The free layer 18 may be a stack in which CoFe or Fe layers having a thickness of 1 nm or more and 2 nm or less and very thin Cu layers having a thickness of 0.1 nm or more and 0.8 nm or less are stacked alternately.

The free layer 18 may includes an amorphous magnetic layer such as a CoZrRb layer, as long as the free layer further includes a magnetic layer having a crystal structure at its interface in contact with the spacer layer 16, which gives a marked influence on the MR ratio. The free layer 18 may have the following structures when observing the spacer layer 16 side. More specifically, the free layer 18 may be, for example, (1) a crystal layer alone, (2) a stack of a crystal layer/an amorphous layer, (3) a stack of a crystal layer/an amorphous layer/a crystal layer, etc. Here, it is important that in all of the (1) to (3), a crystal layer is in contact with the spacer layer 16.

The cap layer 19 has a function of protecting the spin-valve film. The cap layer 19 can be a plurality of metal layers, for example, a two-layer structure of a Cu layer and an Ru layer (Cu [1 nm]/Ru [10 nm]). Further, as the cap layer 19, a Ru/Cu layer in which an Ru layer is placed on the side of the free layer 18 can also be used. In this case, the thickness of the Ru layer is preferably approximately 0.5 to 2 nm. The cap layer 19 of this structure is desirable especially when the free layer 18 is made of NiFe. This is because it can reduce magnetostriction in a mixed interface layer formed between the free layer 18 and the cap layer 19 since Ru is insoluble with Ni.

When the cap layer 19 is either of Cu/Ru or Ru/Cu, the thickness of the Cu layer is preferably approximately 0.5 to 10 nm, and the thickness of the Ru layer is preferably approximately 0.5 to 5 nm. Since Ru has a high specific resistance value, use of an excessively thick Ru layer is not favorable.

As the cap layer 19, a metal layer other than the Cu layer or Ru layer may be provided. For the cap layer 19, another material may be used as long as it can protect the spin-valve film. However, selection of a cap layer may change the MR ratio or the long-term reliability, and therefore care must be taken. In these views, Cu and Ru are desirable examples of a material for the cap layer.

The functional layer 21 has a spin-filter effect that allows control of the permeation of upspin or downspin electrons. The functional layer 21 includes an oxide made of at least one element of Zn, In, Sn and Cd and at least one element of Fe, Co and Ni. For example, a mixed oxide of $Fe_{50}Co_{50}$ and Zn may be used. Zn is more preferred to In, Sn, and Cd, because Zn, Fe, Co, and Ni are in the same period of the periodic table, so that the mixed oxide of Zn with Fe, Co, or Ni is readily magnetized to stabilizes the magnetization of the functional layer 21.

The use of these materials achieves a high spin-filter effect and spin-flip reduction owing to a low resistivity, which results in the increase of the MR ratio of the magnetoresistive element 10.

In view of achieving a spin-filtering layer having a low resistivity, it is effective that the spin-filtering layer includes the above-described oxide material containing Zn, In, Sn, or Cd, such as ZnO, $In_2O_3$, $SnO_2$, ZnO, CdO, $CdIn_2O_4$, $Cd_2SnO_4$, or $Zn_2SnO_4$. One of the reasons why these oxide materials exhibit a low resistivity is considered as follows. These oxide semiconductors have a band gap of 3 eV or more. When the oxide semiconductors are slightly reduced from the stoichiometry, an intrinsic defect such as oxygen vacancy forms a donor level, so that the conduction electron density reaches about $10^{18}$ to $10^{19}$ $cm^{-3}$. In the band structure of these conductive oxides, the valence band is mainly offered by the 2 p orbital of oxygen atoms, and the conduction band is offered by the orbital of metal atoms. When the carrier density at the Fermi level exceeds $10^{18}$ $cm^{-3}$, the conduction band is reached, and a so-called degeneracy state occurs. The oxide semiconductor is referred to as n-type degenerate semiconductor which has sufficient concentration and mobility of conduction electrons, and thus achieves a low resistivity. If any oxide material does not fit in the theory, it may be used as long as it exhibits a low resistivity.

On the other hand, in order to achieve a spin-filteringspin-filtering layer having a high spin-filter effect, spin-filterin- guse of spin-filtering layers containing Co, Fe, and Ni oxides having magnetism at room temperature is effective. The oxide materials containing Zn, In, Sn, and Cd, which are effective for achieving a low resistivity, do not have magnetism in a bulk state. Jpn. Pat. Appln. KOKAI Publication No. 2004-6589 discloses that the insertion of a very thin oxide layer into the free layer or pinned layer of a non-magnetic oxide material develops magnetism therein, and thus achieving a spin-filter effect. However, higher spin-filter effects will be achieved by the addition of Co, Fe, and Ni oxides which readily develop magnetism without limited by the thickness of the oxide layer.

The functional layer 21 may further contain an additional element. It is reported that the addition of Al to a Zn oxide improves the heat resistance. Examples of the additional element other than Al include B, Ga, In, C, Si, Ge and Sn. The mechanism of the improvement of heat resistance is not completely evident, but is presumed to be as follows. That is, the heat-accelerated reoxidation decreases the density of the oxygen vacancy in the Zn oxide produced by slight reduction from the stoichiometry and thus changes the carrier density. As other reason for the improvement of the heat resistance, it is presumed that the above-described elements, which correspond to the dopants of Group III or IV, prevent the acceleration of reoxidation of Zn atom due to heat, thus the change in the carrier density in the functional layer 21 and the resistivity change caused by heat are minimized.

The thickness of the functional layer 21 is preferably 0.5 nm or more thereby achieving a sufficient spin-filtering effect. In order to obtain a higher uniformity of the functional layer 21, in consideration of the dependence on the manufacturing equipment, the thickness is more preferably 1 nm or more. On the other hand, the upper limit of the thickness is preferably 10 nm or less from the viewpoint of preventing the increase of the read-gap of the reproducing head.

MODIFICATION EXAMPLE

A position on which the functional layer 21 is to be provided is not limited to the embodiment shown in FIG. 2 (that is, between the free layer 18 and the spacer layer 16). For example, the functional layer 21 may be inserted into various positions as shown in FIGS. 4 to 9. The modification examples will be described below.

(Modification 1)

Figure 4:
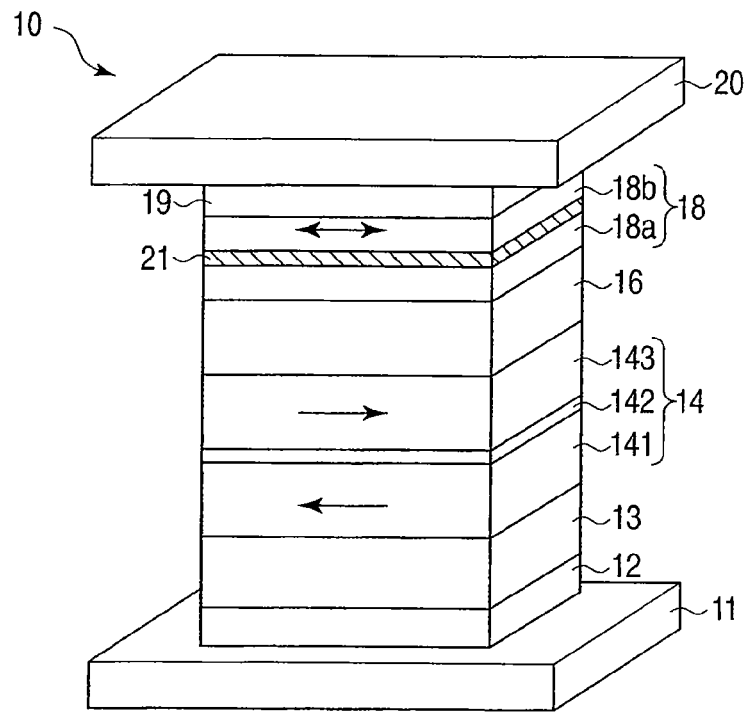
FIG. 4 is a view showing a magnetoresistive element according to a first modification example.

FIG. 4 shows a first modification of the magnetoresistive element 10 according to the embodiment.

The present modification is different from the embodiment in that a functional layer 21 is provided within a free layer 18. The free layer 18 includes a first free layer 18a and a second free layer 18b. The first free layer 18a is provided between a spacer layer 16 and the functional layer 21, and the second free layer 18b is provided between a cap layer 19 and the functional layer 21.

When the functional layer 21 is formed within the free layer 18, the spacer layer 16, the functional layer 21, and the second free layer 18b are formed on the first free layer 18a in this order.

In this manner, even when the functional layer 21 is provided within the free layer 18, the functional layer 21 contributes to spin filtering effect as described above. In addition, the functional layer 21 forms a magnetic coupling with the free layer 18, so that its magnetization direction is unfixed like in the free layer 18, and thus contributes to the increase of the MR ratio of the magnetoresistive element 10, without inhibiting the function of the free layer 18. In addition, dispersion of oxygen contained in the functional layer 21 into the spacer layer 16 is reduced, so that the occurrence of spin-flip in the spacer layer 16 caused by the elemental oxygen in the spacer layer 16 is prevented, whereby a high MR ratio is achieved.

(Modification 2)

Figure 5:
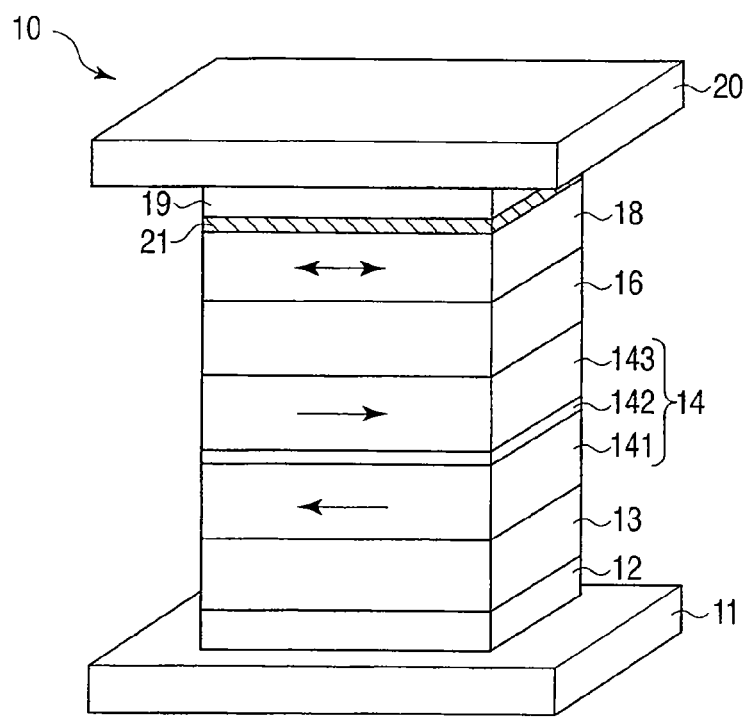
FIG. 5 is a view showing a magnetoresistive element according to a second modification example.

FIG. 5 shows a second modification of the magnetoresistive element 10 according to the embodiment.

The present modification is different from the embodiment in that a functional layer 21 is provided between a free layer 18 and a cap layer 19.

In this manner, even when the functional layer 21 is provided between the free layer 18 and the cap layer 19, as described above, the functional layer 21 contributes to spin filtering effect. In addition, since the functional layer 21 is made of an oxide, it protects the magnetoresistive element 10 from deterioration such as oxidation. Further, dispersion of oxygen contained in the functional layer 21 into a spacer layer 16 is reduced, so that the occurrence of spin-flip in the spacer layer 16 caused by the elemental oxygen in the spacer layer 16 is prevented, whereby a high MR ratio is achieved.

(Modification 3)

FIG. 6 shows a third modification of the magnetoresistive element 10 according to the embodiment.

The present modification is different from the embodiment in that a functional layer 21 is provided between a pinned layer 14 and a spacer layer 16.

In this manner, when the functional layer 21 is provided between the pinned layer 14 and the spacer layer 16, the functional layer 21 contributes to spin-dependent tunneling as described above. In addition, since the functional layer 21 is made of an oxide, it prevents mixing of the material of the spacer layer 16 with the material of the pinned layer 14. As a result of this, the spacer layer 16 allows conduction electrons to pass therethrough while preventing spin-flip, and stably fixes the magnetization of the pinned layer 14.

(Modification 4)

FIG. 7 shows a fourth modification of the magnetoresistive element 10 according to the embodiment.

The present modification is different from the embodiment in that a functional layer 21 is provided within an upper pinned layer 143.

In this manner, even when the functional layer 21 is provided within the upper pinned layer 143, as described above, the functional layer 21 contributes to spin filtering effect. In addition, when the functional layer 21 is arranged at a position not in contact with a tunneling insulator, dispersion of oxygen contained in the functional layer 21 into the tunneling insulator is reduced, so that the occurrence of spin-flip in the tunneling insulator caused by the oxygen element in the tunneling insulator is prevented, whereby a high MR ratio is achieved.

(Modification 5)

FIG. 8 shows a fifth modification of the magnetoresistive element 10 according to the embodiment.

The present modification is different from the embodiment in that a functional layer 21 is provided between an upper pinned layer 143 and a magnetic coupling layer 142.

In this manner, even when the functional layer 21 is provided between the upper pinned layer 143 and the magnetic coupling layer 142, the functional layer 21 contributes to spin filtering effect as described above. When the functional layer 21 is arranged at a position not in contact with the spacer layer, dispersion of oxygen contained in the functional layer 21 into a spacer layer is reduced, so that the occurrence of spin-flip in the spacer layer caused by the oxygen element in the spacer layer is prevented, whereby a high MR ratio is achieved.

(Modification 6)

FIG. 9 shows a sixth modification of the magnetoresistive element 10 according to the embodiment.

The present modification is different from the embodiment in that a functional layer 21 is provided between an upper pinned layer 143 and a spacer layer 16, and that a second functional layer 22 is provided between a spacer layer 16 and a free layer 18.

The composition of the functional layer 21 is the same as that of the functional layer 22, so that the explanation thereof is not repeated here.

In this manner, a synergistic spin-filtering effect of the two functional layers is achieved by forming the functional layer 21 and the second functional layer 22 between the upper pinned layer 143 and the spacer layer 16, and between the spacer layer 16 and the free layer 18, respectively. As a result of this, a higher MR ratio is achieved in comparison with the case using a single functional layer.

The magnetoresistive elements 10 according to Modifications 1 to 6 may be manufactured using the method for manufacturing the magnetoresistive element 10 described in the embodiment, so that the explanations of the methods for making the magnetoresistive elements 10 according to Modifications 1 to 6 are not repeated here.

[Magnetic Head]

Hereinafter, a magnetic head using the magnetoresistive element 10 according to the embodiment will be described.

Figure 10:
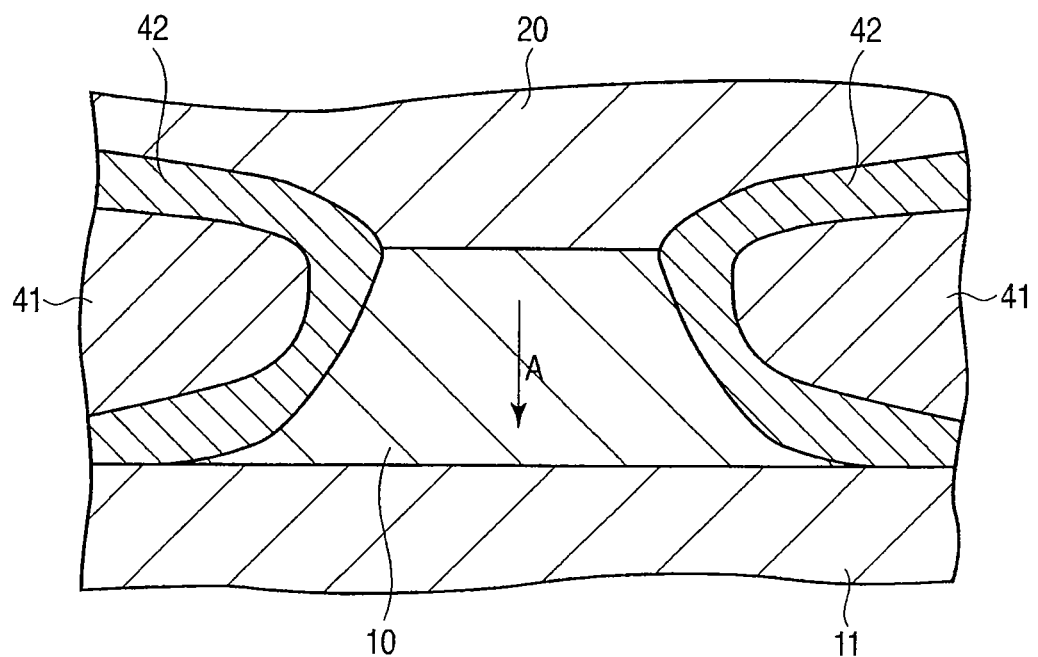
FIG. 10 is a view showing a magnetic head according to the embodiment.
Figure 11:
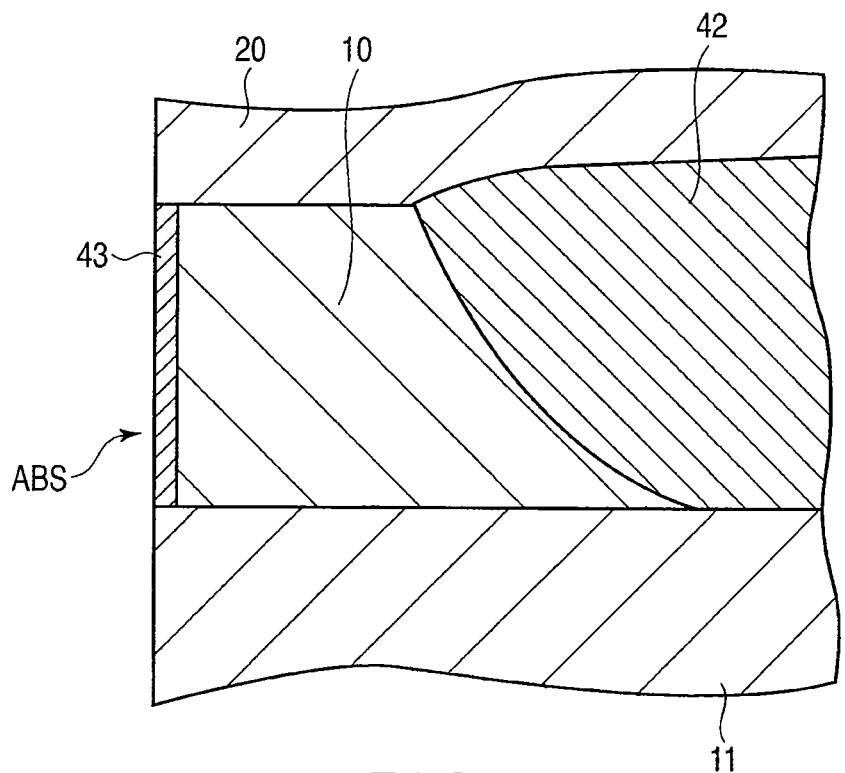
FIG. 11 is a view showing a magnetic head according to the embodiment.

FIGS. 10 and 11 are sectional views showing the magnetic head into which the magnetoresistive element 10 according to the embodiment is incorporated. FIG. 10 is a cross-sectional view of the magnetoresistive element 10, cut almost parallel to an air bearing surface facing a magnetic recording medium (not shown). FIG. 11 is a cross-sectional view of the magnetoresistive element 10, cut perpendicular to the surface facing the medium.

The magnetic head shown in FIGS. 10 and 11 has a so-called hard abutted structure. The lower electrode 11 and the upper electrode 20 are provided under and over the magnetoresistive element 10, respectively. In FIG. 10, bias magnetic field application films 41 and insulating films 42 are stacked on the both sides of the magnetoresistive element 10. As shown in FIG. 11, a protective layer 43 is provided on the air bearing surface of the magnetoresistive element 10.

A sense current for the magnetoresistive element 10 is supplied by the lower electrode 11 and the upper electrode 20 perpendicularly to the plane as shown by arrow A, the electrodes 11 and 20 being arranged under and over the magnetoresistive element 10, respectively. Further, the pair of bias magnetic field application films 41, which are provided on the both sides of the magnetoresistive element 10, applies a bias magnetic field to the magnetoresistive element 10. The bias magnetic field controls the magnetic anisotropy of the free layer 18 in the magnetoresistive element 10 to make the free layer 18 into a single domain. This stabilizes the domain structure of the free layer. It is thus possible to suppress Barkhausen noise associated with movement of magnetic domain walls.

Since the S/N ratio of the magnetoresistive film is improved, the application of the magnetoresistive element 10 to a magnetic head enables sensitive magnetic reproduction.

[Magnetic Recording Apparatus and Magnetic Head Assembly]

A magnetic recording apparatus and a magnetic head assembly including the magnetoresistive element 10 according to the present embodiment are described below.

Figure 12:
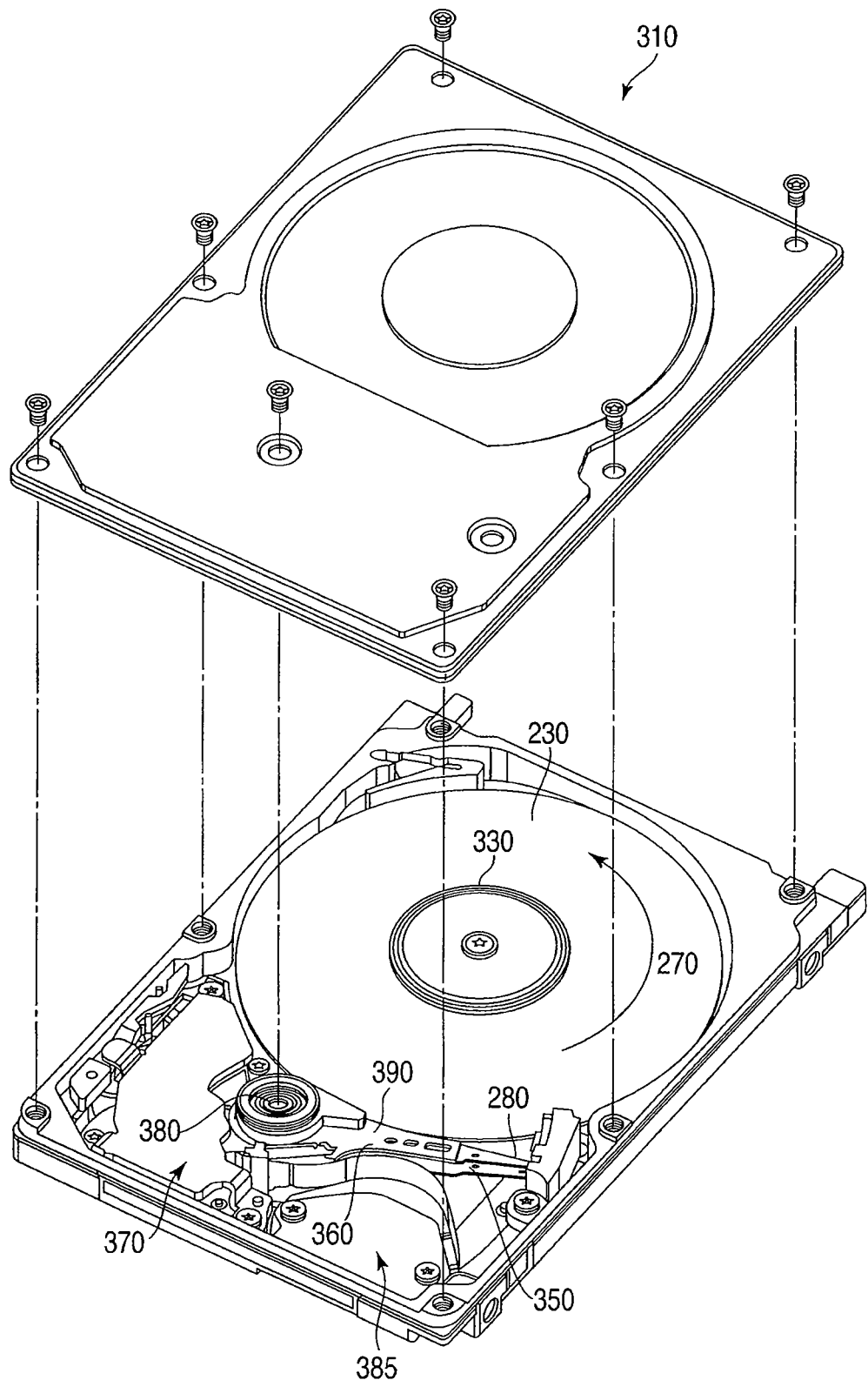
FIG. 12 is a view showing a magnetic recording apparatus according to the embodiment.

FIG. 12 is a perspective view of the magnetic recording apparatus according to the present embodiment.

As shown in FIG. 12, a magnetic recording apparatus 310 according to the present embodiment is of a type using a rotary actuator. A magnetic recording medium 230 is installed on a spindle 330 and rotated in a medium moving direction 270 by a motor (not shown) which responds to control signals from a drive controller (not shown). The magnetic recording apparatus 310 may include a plurality of magnetic recording mediums 230.

Figure 13:
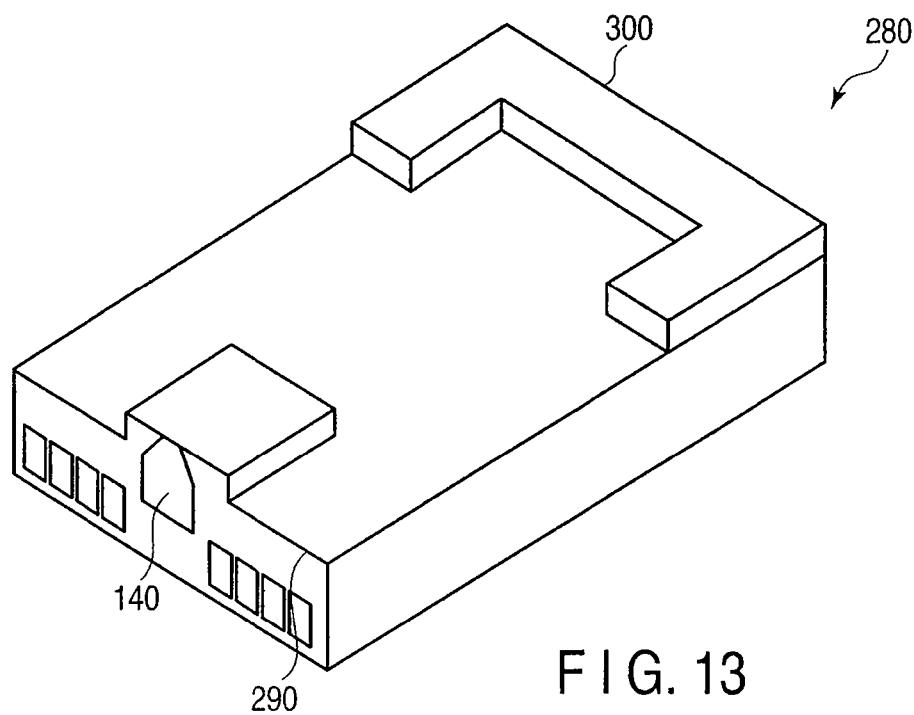
FIG. 13 is a view showing a head slider according to the embodiment.

As shown in FIG. 13, a head slider 280 which records and reproduces the information on the magnetic recording medium 230 includes a magnetic head 140 provided with the magnetoresistive element 10. The head slider 280 is made of, for example, $Al_2O_3$/TiC, and configured to relatively move above the magnetic recording medium 230 such as a magnetic disk while floating thereover or in contact therewith.

The head slider 280 is attached to the tip of a thin film-shaped suspension 350. The magnetic head 140 is provided near the tip of the head slider 280.

When the magnetic recording medium 230 is rotated, the pressing pressure applied by the suspension 350 matches with the pressure developed on the air bearing surface of the head slider 280. The air bearing surface of the head slider 280 is kept away from the surface of the magnetic recording medium 230 at a predetermined floating height. The head slider 280 may be of "in-contact type" which contacts with the magnetic recording medium 230.

The suspension 350 is connected to one end of an actuator arm 360 which includes a bobbin part supporting a driving coil (not shown). A voice coil motor 370, which is a kind of linear motor, is provided at the other end of the actuator arm 360. The voice coil motor 370 may include a magnetic circuit including the driving coil (not shown), which is wound around the bobbin part of the actuator arm 360, and a permanent magnet and a counter yoke which are provided to face each other so as to sandwich the driving coil.

The actuator arm 360 is held by ball bearings (not shown) provided at the top and bottom of a pivot 380, and is configured to be swingably slid by the voice coil motor 370. This allows free moving of the magnetic head 140 to any position on the magnetic recording medium 230.

FIG. 14A shows a head stack assembly 390 as a portion of the magnetic recording apparatus 310 according to the present embodiment.

FIG. 14B is a perspective view showing a magnetic head assembly (head gimbal assembly [HGA]) 400 as a portion of the head stack assembly 390.

As shown in FIG. 14A, the head stack assembly 390 includes the pivot 380, a head gimbal assembly 400 extending from the pivot 380, and a support frame 420 which extends from the pivot 380 in a direction opposite to the head gimbal assembly 400 and supports a coil 410 of the voice coil motor.

As shown in FIG. 14B, the head gimbal assembly 400 includes the actuator arm 360 extending from the pivot 380, and the suspension 350 extending from the actuator arm 360.

The head slider 280 including a magnetic recording head 140, which has been described in the second embodiment, is provided at the tip of the suspension 350.

The magnetic head assembly (head gimbal assembly [HGA]) 400 according to the present embodiment includes the magnetic recording head 140 described in the second embodiment, the head slider 280 including the magnetic recording head 140, the suspension 350 equipped with the head slider 280 at one end thereof, and the actuator arm 360 connected to the other end of the suspension 350.

The suspension 350 includes leads (not shown) for reading and writing signals, for heater for controlling the floating height, and for STO10. The leads are electrically connected to the electrodes of the magnetic recording head 140 included in the head slider 280. Electrode pads (not shown) are provided in the head gimbal assembly 400. In the present embodiment, eight electrode pads are provided; two electrode pads for the coil of a main magnetic pole 200, two electrode pads for a magnetic reproducing element 190, two electrode pads for dynamic flying height (DFH), and two electrode pads for STO10.

A signal processor 385 (not shown) is provided on the back of the magnetic recording apparatus 310 shown in FIG. 12. The signal processor 385 reads and writes signals to the magnetic recording medium 230 using the magnetic recording head 140. The input and output lines of the signal processor 385 are connected to the electrode pads of the head gimbal assembly 400, and electrically coupled with the magnetic recording head 140.

The magnetic recording apparatus 310 according to the present embodiment includes the magnetic recording medium 230, the magnetic recording head 140, a moving unit which can move the opposing magnetic recording medium 230 and magnetic recording head 140 in a relative manner while keeping them away or in contact with each other, a position controller which places the magnetic recording head 140 to a predetermined recording position on the magnetic recording medium 230, and the signal processor 385 which reads and writes signals on the magnetic recording medium 230 using the magnetic recording head 140.

As the magnetic recording medium 230, the above-described magnetic recording medium 230 is used. The above-described moving unit may include the head slider 280. The above-described position controller may include the head gimbal assembly 400.

The magnetic recording apparatus 310 includes the magnetic recording medium 230, the head gimbal assembly 400, and the signal processor 385 which reads and writes signals on the magnetic recording medium 230 using the magnetic recording head 140 included in the head gimbal assembly 400.

Based on the above-described magnetic head and magnetic recording apparatus as the embodiments, any magnetoresistive elements, magnetic heads, magnetic recording apparatuses, and magnetic memories, which may be appropriately modified by those skilled in the art, may also includes the magnetoresistive element according to the above embodiment.

In the above embodiments, although the magnetoresistive element 10 of bottom type is described, the magnetoresistive element 10 of top type, in which the pinned layer 14 is formed above the spacer layer 16, will achieve the effect of the above embodiments.

EXAMPLES

Example 1

A magnetoresistive element was manufactured in accordance with the manufacturing method according to the embodiment, and performance thereof was investigated.

The magnetoresistive element shown in FIG. 2 was manufactured. More specifically, the magnetoresistive element in which the functional layer 21 is provided between the spacer layer 16 and the free layer 18 was manufactured. Details of the layers are as follows.

Underlayer 12: Ta [1 nm]/Ru [2 nm]
Pinning layer 13: $Ir_{22}Mn_{78}$ [7 nm]
Pinned layer 14: $Co_{75}Fe_{25}$ [4 nm]/Ru [0.9 nm]/$Fe_{50}Co_{50}$ [4 nm]

Nonmagnetic spacer layer 16: Cu [3 nm]
Functional layer 21: Zn—Fe$_{50}$Co$_{50}$-O [2 nm]
Free layer 18: Fe$_{50}$Co$_{50}$ [3 nm]

Magnetoresistive elements were manufactured in accordance with the method shown in FIG. 1. Particularly, the functional layer 21 was manufactured as described below. As the first step, Fe$_{50}$Co$_{50}$ [1 nm]/Zn [0.6 nm] was formed as a base material of the functional layer 21. Next, as the second step, a surface of the layer of Fe$_{50}$Co$_{50}$ [1 nm]/Zn [0.6 nm] described above was converted into Zn—Fe$_{50}$Co$_{50}$-O [2 nm] by ion beam oxidation (IAO), plasma oxidation, or natural oxidation. In Examples, a reduction treatment using Ar plasma, ion, or radical as the reducing gas was performed after the oxidation treatment. In contrast, the reduction treatment was not performed in Comparative Examples. Details of each of the treatments are shown in the Tables.

An MR change ratio and areal resistance RA of each of the manufactured magnetoresistive elements are measured. The MR change ratios and the areal resistance RA were measured by a direct current four-terminal method.

The manufactured magnetoresistive elements and measurement results thereof are summarized in Tables 1-1 to 1-3 shown below.

oxidation in Examples. In the conventional functional layer formation, trivalent (which is an insulating valence) α-(FeCoZN)$_2$O$_3$ or γ-(FeCoZN)$_2$O$_3$ is formed in FeCoZn mixed oxides to entail resistivity of the functional layer. Since the increase in resistance of the functional layer promotes occurrence of the spin-flip in the functional layer, it is difficult to attain a satisfactory increase in MR change ratio by the spin filtering effect. In contrast, since it is possible to reduce α-(FeCoZN)$_2$O$_3$ and γ-(FeCoZN)$_2$O$_3$ in the functional layer by the irradiation with the reducing gas, it is possible to form the spin filtering layer having the low resistivity. As a result, it is possible to obtain the magnetoresistive elements having the high MR change ratio by the spin filtering effect by suppressing the occurrence ratio of the spin-flip as in Examples.

Figure 15A:
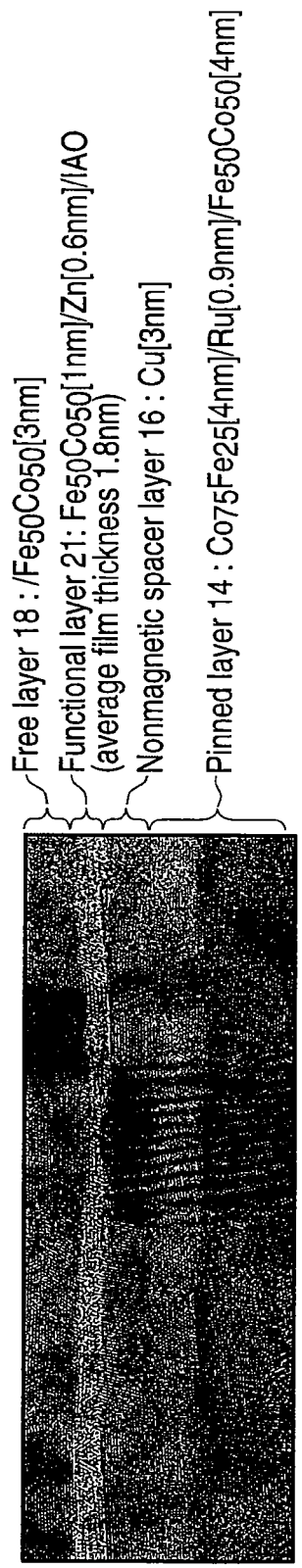
FIGS. 15A and 15B are views showing sections of magnetoresistive elements.
Figure 15B:
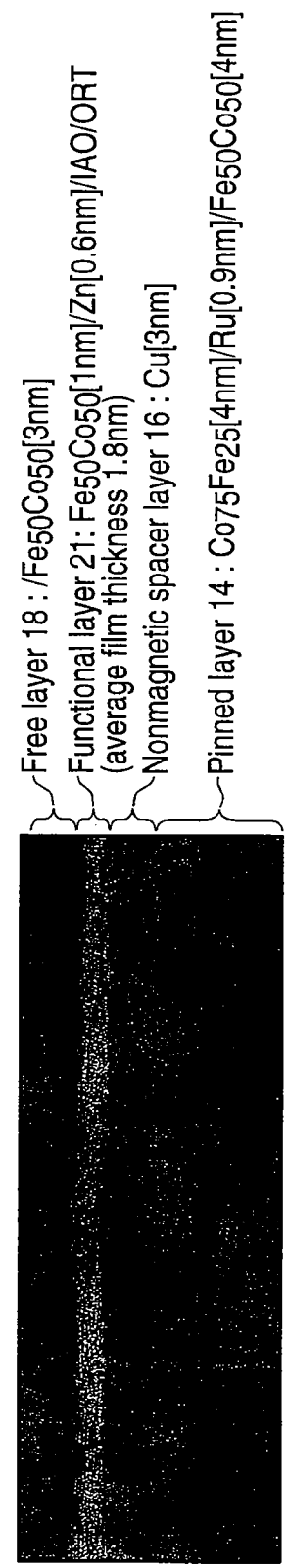

For more detailed analysis, a section of each of the magnetoresistive elements of Comparative Example 1-1 and Example 1-1 was imaged to investigate a minute structure thereof. Results of cross-sectional TEM (transmission election microscopy) analysis are shown in FIGS. 15A and 15B. Shown in FIG. 15A is the section of Comparative Example 1-1, and shown in FIG. 15B is the section of Example 1-1. A film thickness of the functional layer of each of Comparative

TABLE 1-1

| | Oxidation treatment | Reduction treatment | Details of manufacturing process | MR change ratio [%] | RA [Ωμm$^2$] |
|---|---|---|---|---|---|
| REF | None | None | Fe$_{50}$Co$_{50}$ [1 nm] (without functional layer) | 1.5 | 0.07 |
| Comparative Example 1-1 | IAO | None | Fe$_{50}$Co$_{50}$ [1 nm]/Zn [0.6 nm]/ IAO (beam voltage: 60 V, beam current: 60 mA, oxygen exposure degree: 1.5 KL) | 5.4 | 0.25 |
| Example 1-1 | IAO | Ar plasma | Fe$_{50}$Co$_{50}$ [1 nm]/Zn [0.6 nm]/ IAO (beam voltage: 60 V, beam current: 60 mA, oxygen exposure degree: 1.5 KL)/ ORT (RF plasma: 40 W, Ar gas) | 9.4 | 0.20 |
| Example 1-2 | IAO | Ar ion | Fe$_{50}$Co$_{50}$ [1 nm]/Zn [0.6 nm]/ IAO (beam voltage: 60 V, beam current: 60 mA, oxygen exposure degree: 1.5 KL)/ ORT (beam voltage: 60 V, beam current: 60 mA, Ar gas) | 9.0 | 0.21 |
| Example 1-3 | IAO | Ar radical | Fe$_{50}$Co$_{50}$ [1 nm]/Zn [0.6 nm]/ IAO (beam voltage: 60 V, beam current: 60 mA, oxygen exposure degree: 1.5 KL)/ ORT (microwave power: 100 W, Ar gas) | 8.5 | 0.21 |

Shown in Table 1-1 are Comparative Example 1-1 and Examples 1-1 to 1-3. Oxidation by IAO was performed on each of the magnetoresistive elements, and reductions by Ar plasma, ion, and radical were further performed on the magnetoresistive elements of Examples. "REF" in the Table is a reference sample which is a magnetoresistive element of a spin-valve structure which does not include any functional layer.

As shown in Table 1-1, the high MR change ratio was exhibited in the case of performing the reduction treatment by using Ar (Examples 1-1 to 1-3) as compared to the case of not providing any functional layer (REF) and the case of not performing the reduction treatment (Comparative Example 1-1). Also, Comparative Example 1-1 exhibited the higher MR change ratio than REF. However, the increase in MR change ratio of each of Examples 1-1 to 1-3 with respect to REF is much greater than that of Comparative Example 1-1.

The reasons for the great increase in MR change ratio which is enabled by the reduction treatment are considered as follows. The difference between the functional layer formation according to Examples and the conventional functional layer formation is the irradiation with the reducing gas (oxygen reduction treatment [ORT]) which is performed on the film which is oxidized by natural oxidation, IAO or plasma Example 1-1 and Example 1-1 was 1.8 nm. From the results, it is confirmed that etching of the functional layer is not caused by the Ar plasma irradiation. In view of the above, it is confirmed that the increase in MR change ratio is enabled by ORT even in the case where the film thickness of the functional layer is not changed.

Further, elements contained in the each layer of Comparative Example 1-1 and Example 1-1 were analyzed. Results of analysis by using a three-dimensional atomic probe are shown in FIGS. 16A and 16B. Shown in FIG. 16A are the results of Comparative Example 1-1, and shown in FIG. 16B are the results of Example 1-1. From FIG. 16A, it is apparent that an oxygen content in the functional layer of Comparative Example 1-1 is about 20 atomic %. In contrast, it is apparent that an oxygen content in the functional layer of Comparative Example 1-1 is about 10 atomic %. Namely, it is confirmed the oxygen content in the functional layer is reduced by the reduction treatment. Since it is confirmed by the cross-sectional TEM images shown in FIGS. 15A and 15B that the film thickness of the functional layer is not reduced by ORT, it is confirmed that the functional layer is reduced by ORT in view of the results using the three-dimensional atomic probe shown in FIGS. 16A and 16B.

Further, in order to evaluate crystallinity of the functional layers of Comparative Example 1-1 and Example 1-1, model films each consisting of 30 layers of the functional layer were prepared, and X-ray diffraction measurements of the model films were performed.

21 contributes to a reduction of defect in the functional layer 21 and is capable of reducing scattering which does not depend on spin during electron conduction, the crystallinity improvement is favorable from the viewpoint of attaining the high MR change ratio.

TABLE 1-2

| | Oxidation treatment | Reduction treatment | Details of manufacturing process | MR change ratio [%] | RA [Ωμm$^2$] |
|---|---|---|---|---|---|
| REF | None | None | $Fe_{50}Co_{50}$ [1 nm] (without functional layer) | 1.5 | 0.07 |
| Comparative Example 1-1 | IAO | None | $Fe_{50}Co_{50}$ [1 nm]/Zn [0.6 nm]/ IAO (beam voltage: 60 V, beam current: 60 mA, oxygen exposure degree: 1.5 KL) | 5.4 | 0.25 |
| Comparative Example 1-2 | Plasma oxidation | None | $Fe_{50}Co_{50}$ [1 nm]/Zn [0.6 nm]/ Plasma oxidation (RF plasma: 20 W, oxygen exposure degree: 1.5 KL) | 5.0 | 0.25 |
| Comparative Example 1-3 | Natural oxidation | None | $Fe_{50}Co_{50}$ [1 nm]/Zn [0.6 nm]/ Natural oxidation (oxygen exposure degree: 200 KL) | 4.0 | 0.20 |
| Example 1-1 | IAO | Ar plasma | $Fe_{50}Co_{50}$ [1 nm]/Zn [0.6 nm]/ IAO (beam voltage: 60 V, beam current: 60 mA, oxygen exposure degree: 1.5 KL)/ ORT (RF plasma: 40 W, Ar gas) | 9.4 | 0.20 |
| Example 1-4 | Plasma oxidation | Ar plasma | $Fe_{50}Co_{50}$ [1 nm]/Zn [0.6 nm]/ Plasma oxidation (RF plasma: 20 W, oxygen exposure degree: 1.5 KL)/ ORT (RF plasma: 40 W, Ar gas) | 9.0 | 0.22 |
| Example 1-5 | Natural oxidation | Ar plasma | $Fe_{50}Co_{50}$ [1 nm]/Zn [0.6 nm]/ Natural oxidation (oxygen exposure degree: 200 KL)/ ORT (RF plasma: 40 W, Ar gas) | 7.5 | 0.18 |

Figure 17:
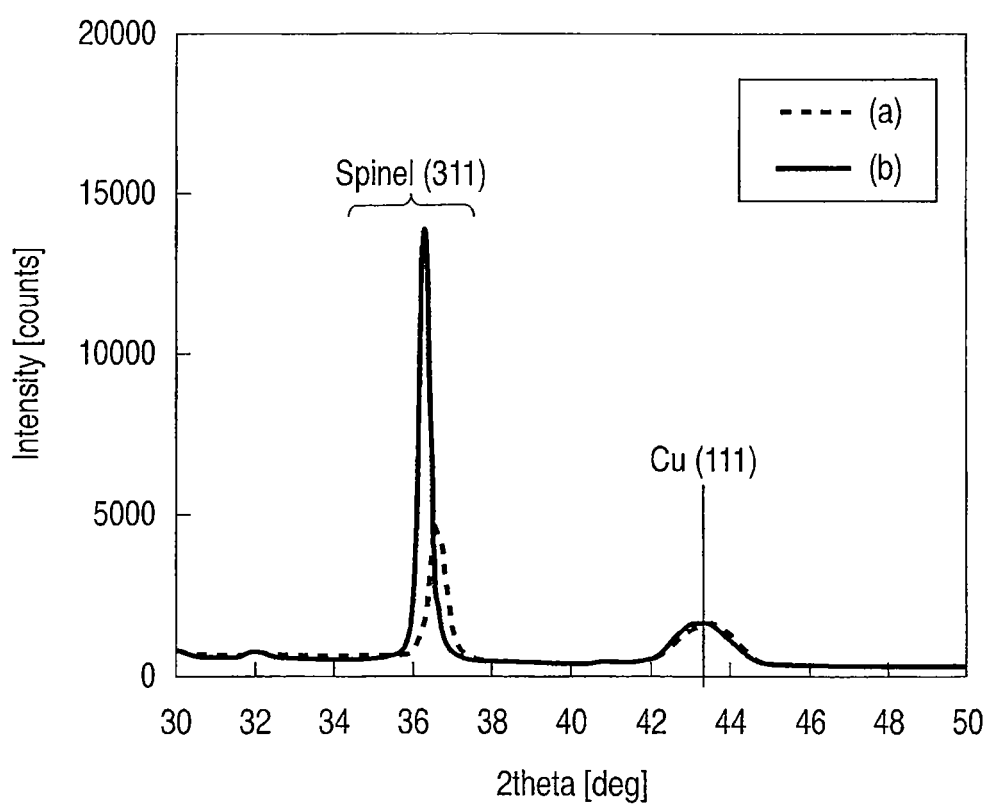
FIG. 17 is a view showing results of X-ray diffraction measurement.

Underlayer: Ta [5 nm]/Cu [5 nm]
Functional layer: $(Zn-Fe_{50}Co_{50}-O$ [2 nm])×30 layers Two functional layers as the model films described above were prepared in the same way as in Comparative Example 1-1 and Example 1-1 to be compared to each other. Results of the X-ray diffraction measurements are shown in FIG. 17. A broken line (a) indicates the result of the sample prepared by the same manufacturing method as that of Comparative Example 1-1, and a solid line (b) indicates the result of the sample prepared by the same manufacturing method as that of Example 1-1. From FIG. 17, it is confirmed that (311) diffraction peak intensity near 2θ=36° of a spinel structure attributable to the $Zn-Fe_{50}Co_{50}-O$ layer of Example 1-1 is increased to about three times that of Comparative Example 1-1. From the results, it is confirmed that the reduction treatment using Ar plasma attains not only the effect of adjusting the oxidation number of the functional layer 21 but also an effect of improving crystallinity of the functional layer 21. Since the improvement in crystallinity of the functional layer Shown in Table 1-2 are Comparative Examples 1-1 to 1-3 and Examples 1-1, 1-4, and 1-5. The oxidation treatment by IAO was performed on Comparative Example 1-1 and Example 1-1; the oxidation treatment by plasma oxidation treatment was performed on Comparative Example 1-2 and Example 1-4; and the oxidation by natural oxidation was performed on Comparative Example 1-3 and Example 1-5. Also, the reduction treatment using Ar plasma was performed on Examples 1-1, 1-4, and 1-5 after the oxidation treatments. "REF" in the Table is a reference sample which is a magnetoresistive element of a spin-valve structure which does not include any functional layer.

As shown in Table 1-2, it is apparent that it is possible to greatly increase the MR change ratio by performing the reduction treatment after the oxidation treatment in the case where IAO, the plasma oxidation, or the natural oxidation is performed as the oxidation treatment.

TABLE 1-3

| | Oxidation treatment | Reduction treatment | Details of manufacturing process | MR change ratio [%] | RA [$\Omega\mu m^2$] |
|---|---|---|---|---|---|
| REF | None | None | $Fe_{50}Co_{50}$ [1 nm] (without functional layer) | 1.5 | 0.07 |
| Comparative Example 1-1 | IAO | None | $Fe_{50}Co_{50}$ [1 nm]/Zn [0.6 nm]/ IAO (beam voltage: 60 V, beam current: 60 mA, oxygen exposure degree: 1.5 KL) | 5.4 | 0.25 |
| Example 1-6 | IAO | Ar plasma | $Fe_{50}Co_{50}$ [1 nm]/Zn [0.6 nm]/ IAO (beam voltage: 60 V, beam current: 60 mA, oxygen exposure degree: 1.5 KL)/ ORT (RF plasma: 10 W, Ar gas) | 7.4 | 0.25 |
| Example 1-7 | IAO | Ar plasma | $Fe_{50}Co_{50}$ [1 nm]/Zn [0.6 nm]/ IAO (beam voltage: 60 V, beam current: 60 mA, oxygen exposure degree: 1.5 KL)/ ORT (RF plasma: 20 W, Ar gas) | 8.5 | 0.23 |
| Example 1-1 | IAO | Ar plasma | $Fe_{50}Co_{50}$ [1 nm]/Zn [0.6 nm]/ IAO (beam voltage: 60 V, beam current: 60 mA, oxygen exposure degree: 1.5 KL)/ ORT (RF plasma: 40 W, Ar gas) | 9.4 | 0.20 |
| Example 1-8 | IAO | Ar plasma | $Fe_{50}Co_{50}$ [1 nm]/Zn [0.6 nm]/ IAO (beam voltage: 60 V, beam current: 60 mA, oxygen exposure degree: 2 KL)/ ORT (RF plasma: 60 W, Ar gas) | 9.3 | 0.22 |
| Example 1-9 | IAO | Ar plasma | $Fe_{50}Co_{50}$ [1 nm]/Zn [0.6 nm]/ IAO (beam voltage: 60 V, beam current: 60 mA, oxygen exposure degree: 2.5 KL)/ ORT (RF plasma: 80 W, Ar gas) | 9.3 | 0.21 |
| Example 1-10 | IAO | Ar plasma | $Fe_{50}Co_{50}$ [1 nm]/Zn [0.6 nm]/ IAO (beam voltage: 60 V, beam current: 60 mA, oxygen exposure degree: 3 KL)/ ORT (RF plasma: 100 W, Ar gas) | 9.3 | 0.20 |
| Example 1-11 | IAO | Ar plasma | $Fe_{50}Co_{50}$ [1 nm]/Zn [0.6 nm]/ IAO (beam voltage: 60 V, beam current: 60 mA, oxygen exposure degree: 3 KL)/ ORT (RF plasma: 120 W, Ar gas) | 7.5 | 0.17 |

Shown in Table 1-3 are Comparative Example 1-1 and Examples 1-1 and 1-6 to 1-11. Comparative Example 1-1 is a magnetoresistive element obtained by not performing any reduction treatment after the oxidation treatment. Examples 1-1 and 1-6 to 1-11 are magnetoresistive elements which were manufactured by performing the reduction treatment using Ar plasma after the oxidation treatment and changing the high-frequency bias for producing plasma within a range of 10 to 120 W. "REF" in the Table is a reference sample which is a magnetoresistive element of a spin-valve structure which does not include any functional layer.

As shown in Table 1-3, the MR change ratio is increased as compared to REF and Comparative Example 1-1 in the case where the reduction treatment is performed (Examples 1-1 and 1-6 to 1-11), and the increase is prominent in the case where the high-frequency bias is within the range of 20 to 100 W or less. Particularly, the highest MR change ratio is exhibited in the case where the high-frequency bias is 40 W (Example 1-1).

Example 2

Magnetoresistive elements were manufactured in accordance with the manufacturing method according to the embodiment, and performances thereof were investigated.

The magnetoresistive elements were manufactured in the same way as in Example 1 except for using He in place of Ar for the reduction treatment. An MR change ratio and an areal resistance RA of each of the manufactured magnetoresistive elements were measured in the same way as in Example 1.

The manufactured magnetoresistive elements and results of the measurements are shown in Table 2 below.

TABLE 2

| | Oxidation treatment | Reduction treatment | Details of manufacturing process | MR change ratio [%] | RA [$\Omega\mu m^2$] |
|---|---|---|---|---|---|
| REF | None | None | $Fe_{50}Co_{50}$ [1 nm] (without functional layer) | 1.5 | 0.07 |
| Comparative Example 2-1 | IAO | None | $Fe_{50}Co_{50}$ [1 nm]/Zn [0.6 nm]/ IAO (beam voltage: 60 V, beam current: 60 mA, oxygen exposure degree: 1.5 KL) | 5.4 | 0.25 |
| Example 2-1 | IAO | He plasma | $Fe_{50}Co_{50}$ [1 nm]/Zn [0.6 nm]/ IAO (beam voltage: 60 V, beam current: 60 mA, oxygen exposure degree: 1.5 KL)/ ORT (RF plasma: 40 W, He gas) | 8.0 | 0.23 |
| Example 2-2 | IAO | He ion | $Fe_{50}Co_{50}$ [1 nm]/Zn [0.6 nm]/ IAO (beam voltage: 60 V, beam current: 60 mA, oxygen exposure degree: 1.5 KL)/ ORT (beam voltage: 60 V, beam current: 60 mA, He gas) | 7.5 | 0.22 |

TABLE 2-continued

| | Oxidation treatment | Reduction treatment | Details of manufacturing process | MR change ratio [%] | RA [Ωμm²] |
|---|---|---|---|---|---|
| Example 2-3 | IAO | He radical | $Fe_{50}Co_{50}$ [1 nm]/Zn [0.6 nm]/ IAO (beam voltage: 60 V, beam current: 60 mA, oxygen exposure degree: 1.5 KL)/ ORT (microwave power: 100 W, He gas) | 7.5 | 0.22 |

Shown in Table 2 are Comparative Example 2-1 and Examples 2-1 to 2-3. Oxidation by IAO was performed on each of the magnetoresistive elements, and reductions using He plasma, ion, and radical were further performed on the magnetoresistive elements of Examples. "REF" in the Table is a reference sample which is a magnetoresistive element of a spin-valve structure which does not include any functional layer.

As shown in Table 2, it is confirmed that Examples 2-1 to 2-3 exhibits the high MR change ratio as compared to REF and Comparative Example 2-1 even in the case where the element used for the reduction treatment is changed to He.

Also, magnetoresistive elements were manufactured in accordance with Example 2-1 by changing the oxidation treatment to plasma oxidation and natural oxidation, and each of the thus-manufactured magnetoresistive elements exhibited a high MR change ratio as in Example 2-1.

Example 3

Magnetoresistive elements were manufactured in accordance with the manufacturing method according to the embodiment, and performances thereof were investigated.

The magnetoresistive elements were manufactured in the same way as in Example 1 except for using Ne in place of Ar for the reduction treatment. An MR change ratio and an areal resistance RA of each of the manufactured magnetoresistive elements were measured in the same way as in Example 1.

The manufactured magnetoresistive elements and results of the measurements are shown in Table 3 below.

each of the magnetoresistive elements, and reductions using Ne plasma, ion, and radical were further performed on the magnetoresistive elements of Examples. "REF" in the Table is a reference sample which is a magnetoresistive element of a spin-valve structure which does not include any functional layer.

As shown in Table 3, it is confirmed that Examples 3-1 to 3-3 exhibits the high MR change ratio as compared to REF and Comparative Example 3-1 even in the case where the element used for the reduction treatment is changed to Ne.

Also, magnetoresistive elements were manufactured in accordance with Example 3-1 by changing the oxidation treatment to plasma oxidation or natural oxidation, and each of the thus-manufactured magnetoresistive elements exhibited a high MR change ratio as in Example 3-1.

Example 4

Magnetoresistive elements were manufactured in accordance with the manufacturing method according to the embodiment, and performances thereof were investigated.

The magnetoresistive elements were manufactured in the same way as in Example 1 except for using Kr in place of Ar for the reduction treatment. An MR change ratio and an areal resistance RA of each of the manufactured magnetoresistive elements were measured in the same way as in Example 1.

The manufactured magnetoresistive elements and results of the measurements are shown in Table 4 below.

TABLE 3

| | Oxidation treatment | Reduction treatment | Details of manufacturing process | MR change ratio [%] | RA [Ωμm²] |
|---|---|---|---|---|---|
| REF | None | None | $Fe_{50}Co_{50}$ [1 nm] (without functional layer) | 1.5 | 0.07 |
| Comparative Example 3-1 | IAO | None | $Fe_{50}Co_{50}$ [1 nm]/Zn [0.6 nm]/ IAO (beam voltage: 60 V, beam current: 60 mA, oxygen exposure degree: 1.5 KL) | 5.4 | 0.25 |
| Example 3-1 | IAO | Ne plasma | $Fe_{50}Co_{50}$ [1 nm]/Zn [0.6 nm]/ IAO (beam voltage: 60 V, beam current: 60 mA, oxygen exposure degree: 1.5 KL)/ ORT (RF plasma: 40 W, Ne gas) | 7.8 | 0.24 |
| Example 3-2 | IAO | Ne ion | $Fe_{50}Co_{50}$ [1 nm]/Zn [0.6 nm]/ IAO (beam voltage: 60 V, beam current: 60 mA, oxygen exposure degree: 1.5 KL)/ ORT (beam voltage: 60 V, beam current: 60 mA, Ne gas) | 7.6 | 0.21 |
| Example 3-3 | IAO | Ne radical | $Fe_{50}Co_{50}$ [1 nm]/Zn [0.6 nm]/ IAO (beam voltage: 60 V, beam current: 60 mA, oxygen exposure degree: 1.5 KL)/ ORT (microwave power: 100 W, Ne gas) | 7.5 | 0.20 |

Shown in Table 3 are Comparative Example 3-1 and Examples 3-1 to 3-3. Oxidation by IAO was performed on The manufactured magnetoresistive elements and results of the measurements are shown in Table 4 below.

TABLE 4

| | Oxidation treatment | Reduction treatment | Details of manufacturing process | MR change ratio [%] | RA [Ωμm²] |
|---|---|---|---|---|---|
| REF | None | None | Fe₅₀Co₅₀ [1 nm] (without functional layer) | 1.5 | 0.07 |
| Comparative Example 4-1 | IAO | None | Fe₅₀Co₅₀ [1 nm]/Zn [0.6 nm]/<br>IAO (beam voltage: 60 V, beam current: 60 mA,<br>oxygen exposure degree: 1.5 KL) | 5.4 | 0.25 |
| Example 4-1 | IAO | Kr plasma | Fe₅₀Co₅₀ [1 nm]/Zn [0.6 nm]/<br>IAO (beam voltage: 60 V, beam current: 60 mA,<br>oxygen exposure degree: 1.5 KL)/<br>ORT (RF plasma: 40 W, Kr gas) | 8.1 | 0.22 |
| Example 4-2 | IAO | Kr ion | Fe₅₀Co₅₀ [1 nm]/Zn [0.6 nm]/<br>IAO (beam voltage: 60 V, beam current: 60 mA,<br>oxygen exposure degree: 1.5 KL)/<br>ORT (beam voltage: 60 V, beam current: 60 mA, Kr gas) | 8.1 | 0.23 |
| Example 4-3 | IAO | Kr radical | Fe₅₀Co₅₀ [1 nm]/Zn [0.6 nm]/<br>IAO (beam voltage: 60 V, beam current: 60 mA,<br>oxygen exposure degree: 1.5 KL)/<br>ORT (microwave power: 100 W, Kr gas) | 7.8 | 0.22 |

Shown in Table 4 are Comparative Example 4-1 and Examples 4-1 to 4-3. Oxidation by IAO was performed on each of the magnetoresistive elements, and reductions using Ne plasma, ion, and radical were further performed on the magnetoresistive elements of Examples. "REF" in the Table is a reference sample which is a magnetoresistive element of a spin-valve structure which does not include any functional layer.

As shown in Table 4, it is confirmed that Examples 4-1 to 4-3 exhibit the high MR change ratio as compared to REF and Comparative Example 4-1 even in the case where the element used for the reduction treatment is changed to Kr.

Also, magnetoresistive elements were manufactured in accordance with Example 4-1 by changing the oxidation treatment to plasma oxidation or natural oxidation, and each of the thus-manufactured magnetoresistive elements exhibited a high MR change ratio as in Example 4-1.

Example 5

Magnetoresistive elements were manufactured in accordance with the manufacturing method according to the embodiment, and performances thereof were investigated.

The magnetoresistive elements were manufactured in the same way as in Example 1 except for using Xe in place of Ar for the reduction treatment. An MR change ratio and an areal resistance RA of each of the manufactured magnetoresistive elements were measured in the same way as in Example 1.

The manufactured magnetoresistive elements and results of the measurements are shown in Table 5 below.

TABLE 5

| | Oxidation treatment | Reduction treatment | Details of manufacturing process | MR change ratio [%] | RA [Ωμm²] |
|---|---|---|---|---|---|
| REF | None | None | Fe₅₀Co₅₀ [1 nm] (without functional layer) | 1.5 | 0.07 |
| Comparative Example 5-1 | IAO | None | Fe₅₀Co₅₀ [1 nm]/Zn [0.6 nm]/<br>IAO (beam voltage: 60 V, beam current: 60 mA,<br>oxygen exposure degree: 1.5 KL) | 5.4 | 0.25 |
| Example 5-1 | IAO | Xe plasma | Fe₅₀Co₅₀ [1 nm]/Zn [0.6 nm]/<br>IAO (beam voltage: 60 V, beam current: 60 mA,<br>oxygen exposure degree: 1.5 KL)/<br>ORT (RF plasma: 40 W, Xe gas) | 8.8 | 0.23 |
| Example 5-2 | IAO | Xe ion | Fe₅₀Co₅₀ [1 nm]/Zn [0.6 nm]/<br>IAO (beam voltage: 60 V, beam current: 60 mA,<br>oxygen exposure degree: 1.5 KL)/<br>ORT (beam voltage: 60 V, beam current: 60 mA, Xe gas) | 8.5 | 0.21 |
| Example 5-3 | IAO | Xe radical | Fe₅₀Co₅₀ [1 nm]/Zn [0.6 nm]/<br>IAO (beam voltage: 60 V, beam current: 60 mA,<br>oxygen exposure degree: 1.5 KL)/<br>ORT (microwave power: 100 W, Xe gas) | 8.2 | 0.20 |

Shown in Table 5 are Comparative Example 5-1 and Examples 5-1 to 5-3. Oxidation by IAO was performed on each of the magnetoresistive elements, and reductions using Xe plasma, ion, and radical were further performed on the magnetoresistive elements of Examples. "REF" in the Table is a reference sample which is a magnetoresistive element of a spin-valve structure which does not include any functional layer.

As shown in Table 5, it is confirmed that Examples 5-1 to 5-3 exhibit the high MR change ratio as compared to REF and Comparative Example 5-1 even in the case where the element used for the reduction treatment is changed to Xe.

Also, magnetoresistive elements were manufactured in accordance with Example 5-1 by changing the oxidation treatment to plasma oxidation or natural oxidation, and each of the thus-manufactured magnetoresistive elements exhibited a high MR change ratio as in Example 5-1.

Example 6

Magnetoresistive elements were manufactured in accordance with the manufacturing method according to the embodiment, and performances thereof were investigated.

The magnetoresistive elements were manufactured in the same way as in Example 1 except for using hydrogen in place of Ar for the reduction treatment. An MR change ratio and an areal resistance RA of each of the manufactured magnetoresistive elements were measured in the same way as in Example 1.

The manufactured magnetoresistive elements and results of the measurements are shown in Table 6 below.

TABLE 6

| | Oxidation treatment | Reduction treatment | Details of manufacturing process | MR change ratio [%] | RA [$\Omega\mu m^2$] |
|---|---|---|---|---|---|
| REF | None | None | $Fe_{50}Co_{50}$ [1 nm] (without functional layer) | 1.5 | 0.07 |
| Comparative Example 6-1 | IAO | None | $Fe_{50}Co_{50}$ [1 nm]/Zn [0.6 nm]/ IAO (beam voltage: 60 V, beam current: 60 mA, oxygen exposure degree: 1.5 KL) | 5.4 | 0.25 |
| Example 6-1 | IAO | H molecule | $Fe_{50}Co_{50}$ [1 nm]/Zn [0.6 nm]/ IAO (beam voltage: 60 V, beam current: 60 mA, oxygen exposure degree: 1.5 KL)/ ORT (H molecule exposure degree: 200 KL) | 6.5 | 0.24 |
| Example 6-2 | IAO | H plasma | $Fe_{50}Co_{50}$ [1 nm]/Zn [0.6 nm]/ IAO (beam voltage: 60 V, beam current: 60 mA, oxygen exposure degree: 1.5 KL)/ ORT (RF plasma: 40 W, $H_2$ gas) | 6.8 | 0.22 |
| Example 6-3 | IAO | H ion | $Fe_{50}Co_{50}$ [1 nm]/Zn [0.6 nm]/ IAO (beam voltage: 60 V, beam current: 60 mA, oxygen exposure degree: 1.5 KL)/ ORT (beam voltage: 60 V, beam current: 60 mA, $H_2$ gas) | 7.0 | 0.21 |
| Example 6-4 | IAO | H radical | $Fe_{50}Co_{50}$ [1 nm]/Zn [0.6 nm]/ IAO (beam voltage: 60 V, beam current: 60 mA, oxygen exposure degree: 1.5 KL)/ ORT (microwave power: 100 W, $H_2$ gas) | 6.8 | 0.22 |

Shown in Table 6 are Comparative Example 6-1 and Examples 6-1 to 6-4. Oxidation by IAO was performed on each of the magnetoresistive elements, and reductions using hydrogen molecule, plasma, ion, or radical were further performed on the magnetoresistive elements of Examples. "REF" in the Table is a reference sample which is a magnetoresistive element of a spin-valve structure which does not include any functional layer.

As shown in Table 6, it is confirmed that Examples 6-1 to 6-4 exhibit the high MR change ratio as compared to REF and Comparative Example 6-1 even in the case where the element used for the reduction treatment is changed to hydrogen.

Also, magnetoresistive elements were manufactured in accordance with Example 6-1 by changing the oxidation treatment to plasma oxidation or natural oxidation, and each of the thus-manufactured magnetoresistive elements exhibited a high MR change ratio as in Example 6-1.

Example 7

Magnetoresistive elements were manufactured in accordance with the manufacturing method according to the embodiment, and performances thereof were investigated.

The magnetoresistive elements were manufactured in the same way as in Example 1 except for using nitrogen in place of Ar for the reduction treatment. An MR change ratio and an areal resistance RA of each of the manufactured magnetoresistive elements were measured in the same way as in Example 1.

The manufactured magnetoresistive elements and results of the measurements are shown in Table 7 below.

Shown in Table 7 are Comparative Example 7-1 and Examples 7-1 to 7-4. Oxidation by IAO was performed on each of the magnetoresistive elements, and reductions using nitrogen molecule, plasma, ion, or radical were further performed on the magnetoresistive elements of Examples. "REF" in the Table is a reference sample which is a magnetoresistive element of a spin-valve structure which does not include any functional layer.

As shown in Table 7, it is confirmed that Examples 7-1 to 7-4 exhibit the high MR change ratio as compared to REF and Comparative Example 7-1 even in the case where the element used for the reduction treatment is changed to N.

Also, magnetoresistive elements were manufactured in accordance with Example 7-1 by changing the oxidation treatment to plasma oxidation or natural oxidation, and each of the thus-manufactured magnetoresistive elements exhibited a high MR change ratio as in Example 7-1.

Example 8

Magnetoresistive elements were manufactured in accordance with the manufacturing method according to the embodiment, and performances thereof were investigated.

The magnetoresistive elements were manufactured in the same way as in Example 1 except for using hydrogen in place of Ar for the reduction treatment. Further, a water elimination step using Ar gas was performed after the reduction treatments. An MR change ratio and an areal resistance RA of each of the manufactured magnetoresistive elements were measured in the same way as in Example 1.

TABLE 7

| | Oxidation treatment | Reduction treatment | Details of manufacturing process | MR change ratio [%] | RA [Ωμm$^2$] |
|---|---|---|---|---|---|
| REF | None | None | Fe$_{50}$Co$_{50}$ [1 nm] (without functional layer) | 1.5 | 0.07 |
| Comparative Example 7-1 | IAO | None | Fe$_{50}$Co$_{50}$ [1 nm]/Zn [0.6 nm]/ IAO (beam voltage: 60 V, beam current: 60 mA, oxygen exposure degree: 1.5 KL) | 5.4 | 0.25 |
| Example 7-1 | IAO | N molecule | Fe$_{50}$Co$_{50}$ [1 nm]/Zn [0.6 nm]/ IAO (beam voltage: 60 V, beam current: 60 mA, oxygen exposure degree: 1.5 KL)/ ORT (N molecule exposure degree: 200 KL) | 5.8 | 0.25 |
| Example 7-2 | IAO | N plasma | Fe$_{50}$Co$_{50}$ [1 nm]/Zn [0.6 nm]/ IAO (beam voltage: 60 V, beam current: 60 mA, oxygen exposure degree: 1.5 KL)/ ORT (RF plasma: 40 W, N$_2$ gas) | 6.5 | 0.23 |
| Example 7-3 | IAO | N ion | Fe$_{50}$Co$_{50}$ [1 nm]/Zn [0.6 nm]/ IAO (beam voltage: 60 V, beam current: 60 mA, oxygen exposure degree: 1.5 KL)/ ORT (beam voltage: 60 V, beam current: 60 mA, N$_2$ gas) | 6.3 | 0.22 |
| Example 7-4 | IAO | N radical | Fe$_{50}$Co$_{50}$ [1 nm]/Zn [0.6 nm]/ IAO (beam voltage: 60 V, beam current: 60 mA, oxygen exposure degree: 1.5 KL)/ ORT (microwave power: 100 W, N$_2$ gas) | 6.0 | 0.22 |

The manufactured magnetoresistive elements and results of the measurements are shown in Table 8 below.

TABLE 8

| | Oxidation treatment | Reduction treatment | Water elimination treatment | Details of manufacturing process | MR change ratio [%] | RA [Ωμm²] |
|---|---|---|---|---|---|---|
| REF | None | None | None | $Fe_{50}Co_{50}$ [1 nm] (without functional layer) | 1.5 | 0.07 |
| Comparative Example 8-1 | IAO | None | None | $Fe_{50}Co_{50}$ [1 nm]/Zn [0.6 nm]/ IAO (beam voltage: 60 V, beam current: 60 mA, oxygen exposure degree: 1.5 KL) | 5.4 | 0.25 |
| Example 8-1 | IAO | H plasma | None | $Fe_{50}Co_{50}$ [1 nm]/Zn [0.6 nm]/ IAO (beam voltage: 60 V, beam current: 60 mA, oxygen exposure degree: 1.5 KL)/ ORT (RF plasma: 40 W, $H_2$ gas) | 6.8 | 0.22 |
| Example 8-2 | IAO | H plasma | Ar ion | $Fe_{50}Co_{50}$ [1 nm]/Zn [0.6 nm]/ IAO (beam voltage: 60 V, beam current: 60 mA, oxygen exposure degree: 1.5 KL)/ ORT (RF plasma: 40 W, $H_2$ gas)/ water elimination step (beam voltage: 60 V, beam current: 60 mA, Ar gas) | 9.0 | 0.22 |
| Example 8-3 | IAO | H plasma | Ar plasma | $Fe_{50}Co_{50}$ [1 nm]/Zn [0.6 nm]/ IAO (beam voltage: 60 V, beam current: 60 mA, oxygen exposure degree: 1.5 KL)/ ORT (RF plasma: 40 W, $H_2$ gas)/ water elimination step (RF plasma: 40 W, Ar gas) | 9.3 | 0.22 |
| Example 8-4 | IAO | H plasma | Ar radical | $Fe_{50}Co_{50}$ [1 nm]/Zn [0.6 nm]/ IAO (beam voltage: 60 V, beam current: 60 mA, oxygen exposure degree: 1.5 KL)/ ORT (RF plasma: 40 W, $H_2$ gas)/ water elimination step (microwave power: 100 W, Ar gas) | 8.8 | 0.22 |

Shown in Table 8 are Comparative Example 8-1 and Examples 8-1 to 8-4. Oxidation by IAO was performed on each of the magnetoresistive elements, and reductions using hydrogen plasma was further performed on the magnetoresistive elements of Examples. The water elimination treatments using Ar ion, plasma, or radial were performed on Examples 8-2 to 8-4. "REF" in the Table is a reference sample which is a magnetoresistive element of a spin-valve structure which does not include any functional layer.

As shown in Table 8, it is confirmed that Examples 8-2 to 8-4 exhibit the high MR change ratio as compared to REF and Comparative Example 8-1 even in the case where the water elimination treatment is performed after the reduction treatment.

Further, it is confirmed that Examples 8-2 to 8-4 exhibit the higher MR change ratio as compared to Example 8-1 for which the water elimination treatment was not performed.

Example 9

Magnetoresistive elements were manufactured in accordance with the manufacturing method according to the embodiment, and performance thereof was investigated.

The magnetoresistive elements were manufactured in the same way as in Example 1 except for using Fe [1 nm]/Zn [0.6 nm] as the base metal layer of the functional layer in place of $Fe_{50}Co_{50}$ [1 nm]/Zn [0.6 nm]. An MR change ratio and areal resistance RA of each of the manufactured magnetoresistive elements were measured in the same way as in Example 1.

The manufactured magnetoresistive elements and results of the measurement are summarized in Table 9 shown below.

TABLE 9

| | Oxidation treatment | Reduction treatment | Details of manufacturing process | MR change ratio [%] | RA [Ωμm$^2$] |
|---|---|---|---|---|---|
| REF | None | None | Fe$_{50}$Co$_{50}$ [1 nm] (without functional layer) | 1.5 | 0.07 |
| Comparative Example 9-1 | IAO | None | Fe [1 nm]/Zn [0.6 nm]/ IAO (beam voltage: 60 V, beam current: 60 mA, oxygen exposure degree: 1.5 KL) | 5.4 | 0.27 |
| Example 9-1 | IAO | Ar plasma | Fe [1 nm]/Zn [0.6 nm]/ IAO (beam voltage: 60 V, beam current: 60 mA, oxygen exposure degree: 1.5 KL)/ ORT (RF plasma: 40 W, Ar gas) | 10.0 | 0.21 |
| Example 9-2 | IAO | Ar ion | Fe [1 nm]/Zn [0.6 nm]/ IAO (beam voltage: 60 V, beam current: 60 mA, oxygen exposure degree: 1.5 KL)/ ORT (beam voltage: 60 V, beam current: 60 mA, Ar gas) | 9.3 | 0.22 |
| Example 9-3 | IAO | Ar radical | Fe [1 nm]/Zn [0.6 nm]/ IAO (beam voltage: 60 V, beam current: 60 mA, oxygen exposure degree: 1.5 KL)/ ORT (microwave power: 100 W, Ar gas) | 9.0 | 0.22 |

Shown in Table 9 are Comparative Example 9-1 and Examples 9-1 to 9-3. Oxidation by IAO was performed on each of the magnetoresistive elements, and reductions by Ar plasma, ion, and radical were further performed on the magnetoresistive elements of Examples. "REF" in the Table is a reference sample which is a magnetoresistive element of a spin-valve structure which does not include any functional layer.

As shown in Table 9, the high MR change ratio was exhibited in the case by performing the reduction treatment by using Ar (Examples 9-1 to 9-3) as compared to the case of not providing any functional layer (REF) and the case of not performing the reduction treatment (Comparative Example 9-1). Also, Comparative Example 9-1 exhibited the higher MR change ratio than REF. However, the increase in MR change ratio of each of Examples 9-1 to 9-3 with respect to REF is much greater than that of Comparative Example 9-1.

By Example 9, it is confirmed that the improvement in the MR change ratio is attained by employing the reduction treatment even in the case of using Fe [1 nm]/Zn [0.6 nm] as the base metal layer of the functional layer in place of Fe$_{50}$Co$_{50}$ [1 nm]/Zn [0.6 nm]. As the base metal layer of the functional layer, a metal layer obtained by combining at least one element selected from the group consisting of Zn, In, Sn, and Cd and at least one element selected from the group consisting of Fe, Co, and Ni may be used in addition to the above-described combination of Fe, Co, and Zn, and it is possible to attain the improvement in MR change ratio by preparing the functional layer by employing the oxidation treatment and the reduction treatment as in Examples.

(Modification Example of Spacer Layer)

Magnetoresistive elements were manufactured in the same way as in the above-described Examples by using a metal spacer layer (Ag or Au) or a tunneling insulator (MgO, Al$_2$O$_3$, or TiO$_2$), and an MR change ratio and areal resistance of each of the magnetoresistive elements were analyzed in the same way.

As a result, it is confirmed that it is possible to greatly change the MR change ratio as compared to the case of not providing any functional layer and the case of performing oxidation treatment and not performing any reduction treatment.

The various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a magnetoresistive element comprising a layered structure and a pair of electrodes allowing an electric current to flow through the layered structure in a thickness direction,
the layered structure comprising:
  a cap layer;
  a magnetization pinned layer;
  a magnetization free layer provided between the cap layer and the magnetization pinned layer;
  a spacer layer provided between the magnetization pinned layer and the magnetization free layer; and
  a functional layer provided in the magnetization pinned layer, between the magnetization pinned layer and the spacer layer, between the spacer layer and the magnetization free layer, in the magnetization free layer, or between the magnetization free layer and the cap layer and comprising an oxide containing at least one element selected from the group consisting of Zn, In, Sn, and Cd and at least one element selected from the group consisting of Fe, Co, and Ni;
the method comprising:
  forming a film comprising a base material of the functional layer;
  performing an oxidation treatment on the film using a gas containing oxygen in a form of at least one selected from the group consisting of molecule, ion, plasma and radical; and
  performing a reduction treatment using a reducing gas on the film after the oxidation treatment.

2. The method of manufacturing a magnetoresistive element of claim 1, wherein the reducing gas comprises at least one selected from the group consisting of argon, helium, neon, krypton and xenon in a form of ion, plasma or radical and/or at least one selected from the group consisting of hydrogen and nitrogen in a form of molecule, ion, plasma or radical.

3. The method of manufacturing a magnetoresistive element of claim 2, wherein the ion or plasma of argon, helium, neon, krypton, or xenon is produced in the reduction treatment using a high-frequency bias of 20 to 100 W or less.

4. The method of manufacturing a magnetoresistive element of claim 1, wherein the reducing gas comprises at least one selected from the group consisting of argon, helium, neon, krypton, xenon, hydrogen and nitrogen in a form of ion or plasma.

5. The method of manufacturing a magnetoresistive element of claim 1, wherein the reducing gas comprises argon in a form of ion or plasma.

6. The method of manufacturing a magnetoresistive element of claim 1, wherein crystallinity of the film is improved by the reduction treatment.

7. The method of manufacturing a magnetoresistive element of claim 1, wherein the reduction treatment is performed while heating the film.

8. The method of manufacturing a magnetoresistive element of claim 1, further comprising performing, on the film after the reduction treatment, at least one moisture elimination treatment selected from the group consisting of irradiation with an argon ion, irradiation with argon plasma, and heating.

9. The method of manufacturing a magnetoresistive element of claim 8, wherein the reduction treatment and the moisture elimination treatment are repeated a plurality of times.

10. The method of manufacturing a magnetoresistive element of claim 8, wherein the film formation, the oxidation treatment, the reduction treatment, and the moisture elimination treatment are repeated a plurality of times.

11. The method of manufacturing a magnetoresistive element of claim 1, wherein the film formation, the oxidation treatment, and the reduction treatment are repeated a plurality of times.

12. The method of manufacturing a magnetoresistive element of claim 1, wherein the film formation and the oxidation treatment are repeated a plurality of times.

13. The method of manufacturing a magnetoresistive element of claim 1, wherein the oxidation treatment comprises converting the base material of the functional layer into an oxide by supplying the film with gaseous oxygen in an atmosphere obtained by ionization or plasma formation of a gas containing at least one selected from the group consisting of argon, xenon, helium, neon, and krypton.

* * * * *